United States Patent
Cheng et al.

(10) Patent No.: US 11,171,172 B2
(45) Date of Patent: Nov. 9, 2021

(54) IMAGE SENSOR AND METHOD OF FORMING THE SAME

(71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Kuo-Cheng Lee, Tainan (TW); Ying-Hao Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 194 days.

(21) Appl. No.: 16/512,834

(22) Filed: Jul. 16, 2019

(65) Prior Publication Data

US 2021/0020671 A1    Jan. 21, 2021

(51) Int. Cl.
*H01L 27/146* (2006.01)

(52) U.S. Cl.
CPC .... *H01L 27/1464* (2013.01); *H01L 27/14629* (2013.01); *H01L 27/14636* (2013.01); *H01L 27/14685* (2013.01); *H01L 27/1463* (2013.01); *H01L 27/14621* (2013.01)

(58) Field of Classification Search
CPC ........... H01L 27/14685; H01L 27/1464; H01L 27/14636; H01L 27/1463; H01L 27/14629; H01L 27/14621; H01L 21/3086; H01L 21/3085; H01L 21/0337; H01L 21/0335
See application file for complete search history.

(56) References Cited

U.S. PATENT DOCUMENTS

| | | | | |
|---|---|---|---|---|
| 5,942,771 A | * | 8/1999 | Ishimura | H01L 31/0352 257/184 |
| 6,498,336 B1 | * | 12/2002 | Tian | H01L 27/1462 250/214.1 |
| 7,786,020 B1 | * | 8/2010 | Kang | H01L 21/02071 438/734 |
| 7,982,177 B2 | * | 7/2011 | Nozaki | H01L 27/14685 250/239 |

(Continued)

FOREIGN PATENT DOCUMENTS

| CN | 103811511 A | * | 5/2014 |
|---|---|---|---|
| CN | 108878464 A | * | 11/2018 |

(Continued)

*Primary Examiner* — Earl N Taylor
(74) *Attorney, Agent, or Firm* — McClure, Qualey & Rodack, LLP

(57) ABSTRACT

A back side illumination (BSI) image sensor is provided. The BSI image sensor includes a semiconductor substrate, a first dielectric layer, a reflective element, a second dielectric layer and a color filter layer. The semiconductor substrate has a front side and a back side. The first dielectric layer is disposed on the front side of the semiconductor substrate. The reflective element is disposed on the first dielectric layer, in which the reflective element has an inner sidewall contacting the first dielectric layer, and the inner sidewall has a zigzag profile. The second dielectric layer is disposed on the first dielectric layer and the reflective element. The color filter layer is disposed on the backside of the semiconductor substrate.

20 Claims, 27 Drawing Sheets

(56) References Cited

U.S. PATENT DOCUMENTS

| | | | | |
|---|---|---|---|---|
| 8,816,415 B2* | 8/2014 | Lin | H01L 27/14629 | 257/292 |
| 9,620,544 B2* | 4/2017 | Chung | H01L 27/1463 | |
| 10,910,424 B2* | 2/2021 | Hatano | H01L 27/14636 | |
| 2007/0241376 A1* | 10/2007 | Inoue | H01L 27/14812 | 257/291 |
| 2009/0050947 A1* | 2/2009 | Dungan | H01L 27/14625 | 257/294 |
| 2009/0194671 A1* | 8/2009 | Nozaki | H01L 27/14685 | 250/208.1 |
| 2010/0032659 A1* | 2/2010 | Yoshida | H01L 27/14625 | 257/40 |
| 2011/0049330 A1* | 3/2011 | Adkisson | H01L 27/14683 | 250/208.1 |
| 2011/0090384 A1* | 4/2011 | Yamada | H01L 27/14625 | 348/294 |
| 2011/0254115 A1* | 10/2011 | Shih | H01L 27/14685 | 257/432 |
| 2012/0009720 A1* | 1/2012 | Shim | H01L 27/14685 | 438/70 |
| 2014/0035083 A1* | 2/2014 | Wan | H01L 27/14685 | 257/432 |
| 2014/0117481 A1* | 5/2014 | Kato | H01L 27/14629 | 257/432 |
| 2015/0011027 A1* | 1/2015 | Lian | H01L 22/26 | 438/16 |
| 2015/0061062 A1* | 3/2015 | Lin | H01L 27/1464 | 257/432 |
| 2015/0263054 A1* | 9/2015 | Chien | H01L 27/1464 | 257/292 |
| 2016/0043125 A1* | 2/2016 | Hatano | H01L 27/14634 | 257/40 |
| 2018/0166475 A1* | 6/2018 | Chen | H01L 27/1463 | |
| 2020/0075657 A1* | 3/2020 | Huang | H01L 27/14612 | |
| 2020/0075661 A1* | 3/2020 | Cheng | H01L 27/14685 | |
| 2020/0328243 A1* | 10/2020 | Micinski | H01L 27/14649 | |
| 2021/0020671 A1* | 1/2021 | Cheng | H01L 27/14636 | |
| 2021/0082982 A1* | 3/2021 | Oshiyama | H01L 31/10 | |

FOREIGN PATENT DOCUMENTS

| | | | | |
|---|---|---|---|---|
| CN | 109411491 A | * | 3/2019 | H01L 27/1464 |
| CN | 109841641 A | * | 6/2019 | H01L 27/14685 |
| CN | 109906512 A | * | 6/2019 | H01L 27/1463 |
| CN | 110364543 A | * | 10/2019 | |
| CN | 108183112 B | * | 9/2020 | H01L 27/14629 |
| WO | WO-2014162705 A1 | * | 10/2014 | H01L 27/14629 |

* cited by examiner

IMAGE SENSOR AND METHOD OF FORMING THE SAME

BACKGROUND

Digital cameras and other imaging devices employ images sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
FIG. 1A through FIG. 1C are a schematic flow chart showing a method of forming an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor converts variable attenuation of light waves (as they pass through or reflect off objects) into signals and small bursts of current that convey the information. A photodiode layer is a light-sensing structure which absorbs light and converts a light photon into an electron to produce an electrical signal resulting in an image. As a result, a number of the light photon collected by the photodiode layer has an impact on performance of the image sensor. However, a portion of the light, especially that having a long wavelength (e.g., near infrared or non-visible light), is likely to pass through the photodiode layer and cannot be absorbed by the photodiode layer, resulting in unsatisfactory performance of the image sensor. Accordingly, a reflective element is required in the image sensor to collect the portion of the light that passes through the photodiode layer, and further reflect the light back toward the photodiode layer.

Embodiments of the present disclosure are directed to providing an image sensor and a method of producing the image sensor. In some embodiments, a reflective element is disposed in a dielectric layer under a photodiode layer, and the reflective element is configured to collect the light that cannot be absorbed by the photodiode layer in time and reflect the light back toward the photodiode layer. In other embodiments, the method of producing the image sensor includes forming the reflective element by several photoresist-trimming operations and etching operations using a same mask, followed by a deposition operation to deposit a material of the reflective element. The reflective element having a concave profile (or U shape) is then formed, and a radian of the concave profile may be adjusted according to the photoresist-trimming operations and etching operations. The configuration of the reflective element in the image sensor improves the absorption of the light in the photodiode layer, thereby enhancing the electron signal converted from the photon, such that a brighter, vivid image can be achieved by the image sensor.

Figure 1B:
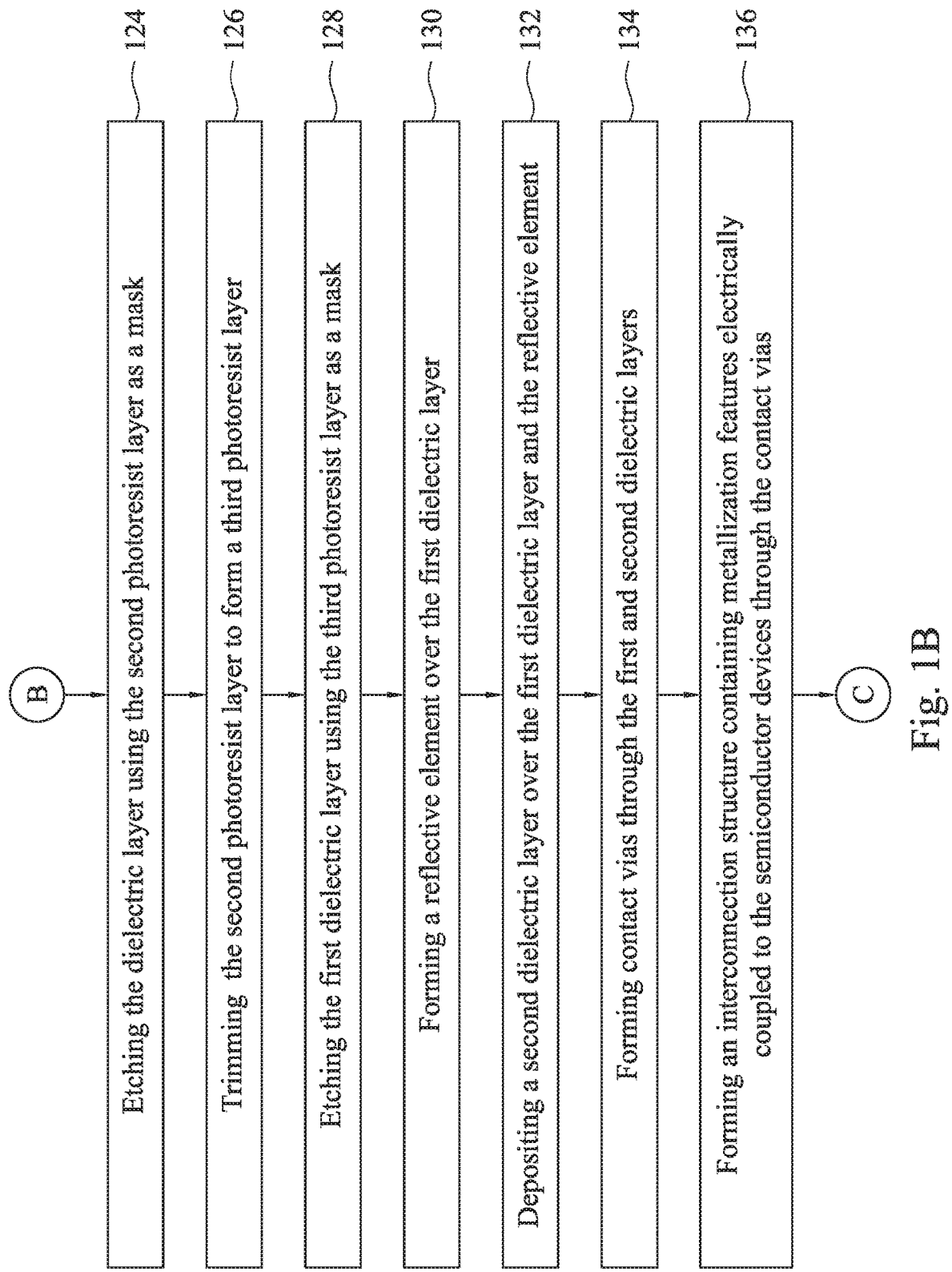
Figure 1C:
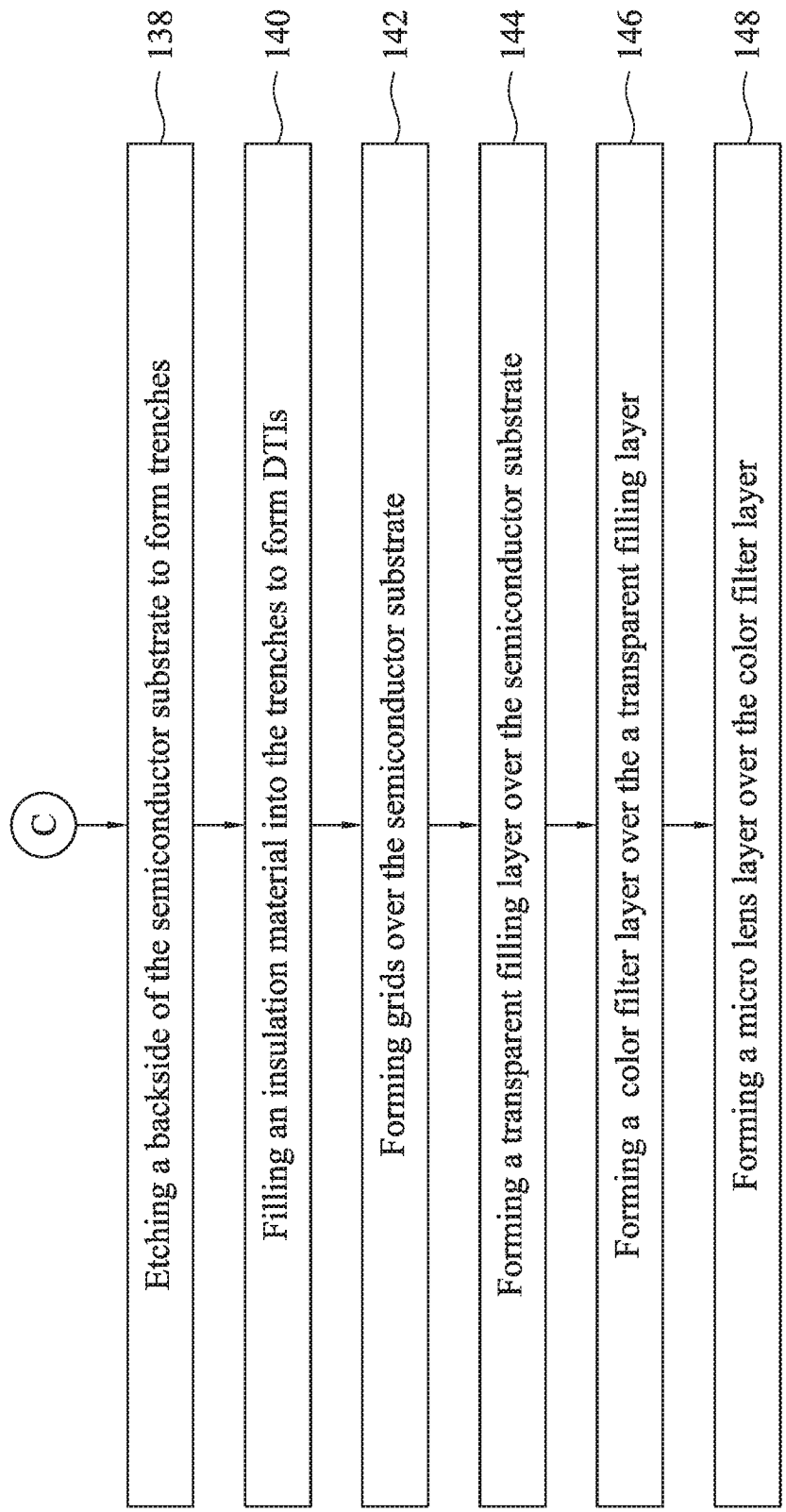

FIG. 1A through FIG. 1C are a schematic flow chart showing a method of forming an image sensor in accordance with some embodiments of the present disclosure. FIG. 2 through FIG. 22 are schematic cross-sectional views showing various intermediate stages of a method of forming an image sensor in accordance with some embodiments of the present disclosure.

Figure 2:
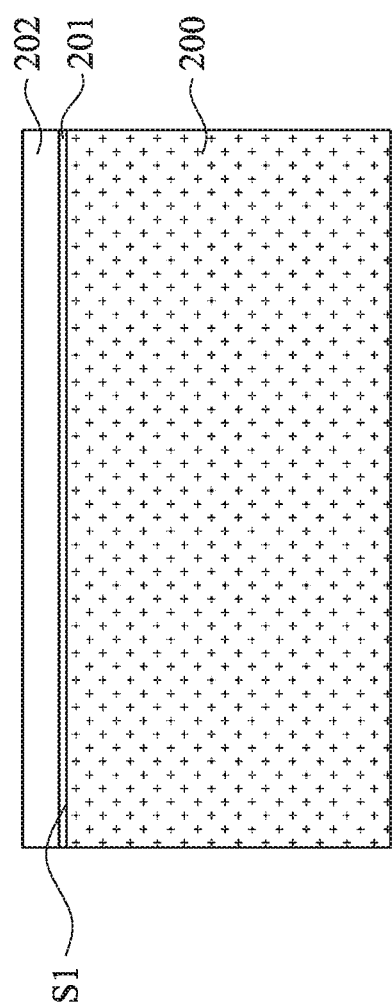
FIG. 2 through FIG. 21 are schematic cross-sectional views showing various intermediate stages of a method of forming an image sensor in accordance with some embodiments of the present disclosure.

Reference is made to FIG. 1A and FIG. 2. At operation 110, a semiconductor substrate is provided. In embodiments of the operation 110, a semiconductor substrate 200 having a gate dielectric layer 201 and a gate electrode layer 202 thereon is provided. In some embodiments, the semiconductor substrate 200 may include an isolation region (not shown) formed by etching a trench in the semiconductor substrate 200 on a front side S1 and filling the trench with insulator materials such as silicon oxide, silicon nitride, or silicon oxynitride. In an embodiment, the semiconductor substrate 200 is made from silicon. The semiconductor substrate 200 includes bulk silicon, a semiconductor wafer, a silicon-on-insulator (SOI) substrate, or a silicon germanium substrate. Other semiconductor materials including group III, group IV, and group V elements are used in some embodiments. The semiconductor substrate 200 is undoped in some embodiments. In some other embodiments, the semiconductor substrate 200 is doped with a p-type dopant or an n-type dopant.

The gate dielectric layer 201 covers over the semiconductor substrate 200. In an embodiment, the gate dielectric layer 201 is a thin film formed by a suitable deposition process. The gate electrode layer 202 covers on top of the gate dielectric layer 201. In an embodiment, the gate dielectric layer 201 and the gate electrode layer 202 are sequentially deposited over semiconductor substrate 200 by some deposition processes. In some embodiments, the gate electrode layer 202 is made of polysilicon. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The gate electrode layer 202 is deposited above the front side S1 of the semiconductor substrate 200.

Figure 3:
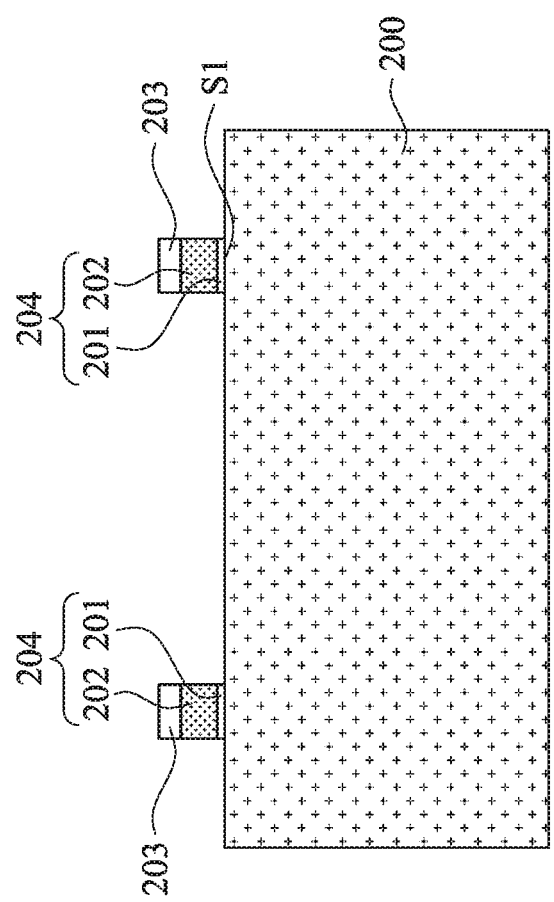
Figure 4:
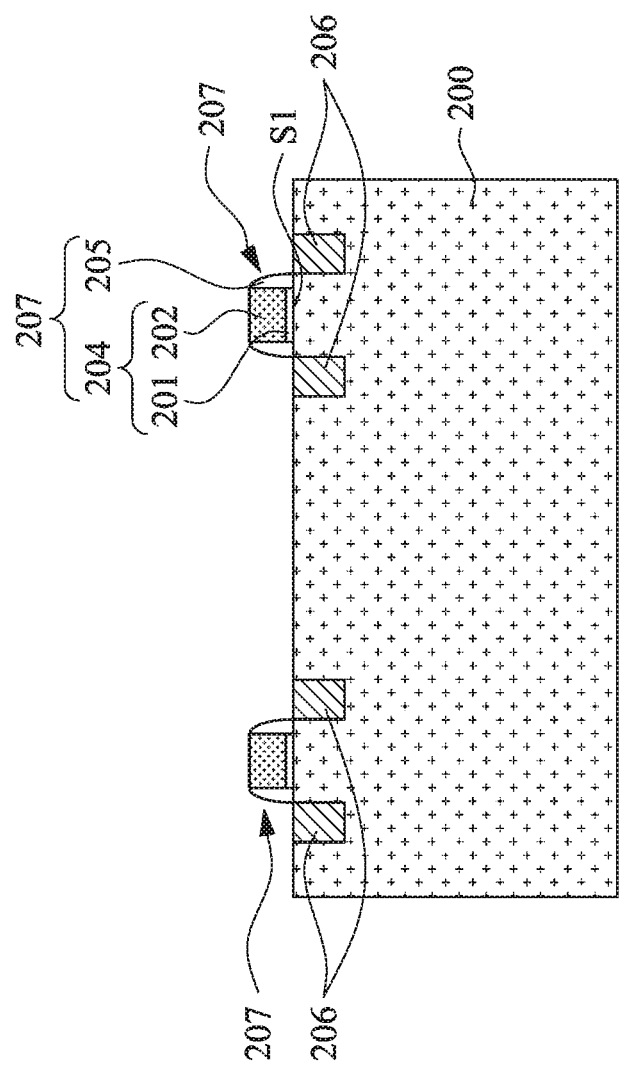

Reference is made to FIG. 1A, FIG. 3 and FIG. 4. At operation 112, semiconductor devices are formed over the semiconductor substrate. In some embodiments of the operation 112, gate stacks 204 are formed by patterning the gate dielectric layer 201 and the gate electrode layer 202 by using resists 203 as masks. The gate dielectric layer 201 and the gate electrode layer 202 are patterned by an etching process. In some embodiments, the gate dielectric layer 201 is patterned after the gate electrode layer 202 is patterned. A layer of the resists 203 is formed on top of the gate electrode layer 202 by a suitable process, such as spin-on coating, and patterned to form the resists 203 by a photolithography patterning method. The resists 203 can then be used as the masks in the etching process for forming some underlying layers (e.g., the gate electrode layer 202 or gate dielectric layer 201). The etching process may be any suitable etching process such as dry etching, wet etching, reactive ion etching (RIE), and/or other etching methods. The resists 203 are then stripped thereafter.

Reference is made to FIG. 4. Spacers 205 are then formed on two opposing sides of each of the gate stacks 204, thereby forming semiconductor devices 207. The spacers 205 are formed using any suitable process, including some processes described herein. A layer (not shown) is conformally deposited over the gate stacks 204 and semiconductor substrate 200 by a deposition process. In some embodiments, the layer is made of dielectric materials such as silicon nitride, silicon nitride doped with carbon, silicon carbide, silicon oxide, silicon oxynitride, nitride with lower K, silicon oxynitride doped with carbon, other suitable materials, and/or combinations thereof. The layer is etched by any suitable etching process to form the spacers 205. In some embodiments, an anisotropic etching process by a dry etching process is used without photolithography. Some portions of the layer deposited on top of the gate stacks 204 and on front side S of the semiconductor substrate 200 are etched faster than some vertical portions of the layer proximate to two opposing sides of the gate stacks 204.

Figure 5:
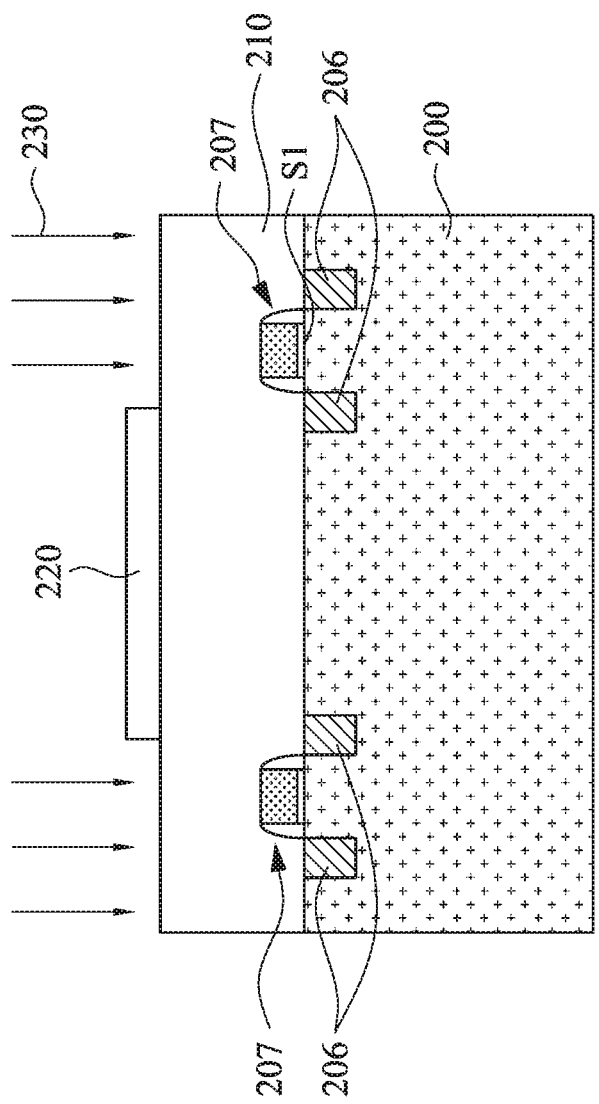

Reference is made to FIG. 1A and FIG. 5. At operation 114, source/drain regions are formed on two opposing sides of each of the semiconductor devices. In some embodiments of the operation 114, source/drain regions 206 are formed by ion implantation or epitaxially growth, such that the semiconductor devices 207 are coupled to the source/drain regions 206 on the front side S1.

Still refer to FIG. 1A and FIG. 5. At operation 116, a first dielectric layer is formed to cover the semiconductor substrate and the gate stacks. In some embodiments of the operation 116, a first dielectric layer 210 is deposited on the semiconductor substrate 200 and the semiconductor devices 207. In some embodiments, a thickness of the first dielectric layer 210 is in a range from about 500 Å to about 5000 Å. When the thickness of the first dielectric layer 210 is smaller than about 500 Å, a reflective element having a proper radian may not be formed. When the thickness of the first dielectric layer 210 is greater than 5000 Å, an operation for forming a contact may be challenging because of a high aspect ratio of a contact via. In some embodiments, the first dielectric layer 210 may be made from silicon oxide, silicon nitride, silicon oxynitride, a low-k material, or another suitable dielectric material. After the deposition of the first dielectric layer 210, a chemical mechanical polishing (CMP) process may be performed to planarize a surface of the first dielectric layer 210.

Still refer to FIG. 1A and FIG. 5. At operation 118, a first photoresist layer is formed over the first dielectric layer. In some embodiments of the operation 118, a photoresist layer 220 is formed over the first dielectric layer 210 and covers a portion of the first dielectric layer 210. In this embodiment, the photoresist layer 220 includes a positive tone photoresist material where the portion of the photoresist exposed to light becomes soluble to a developer solution, or a negative tone photoresist material where the portion of the photoresist not exposed to light become soluble to the developer solution. A material of the photoresist layer 220 is deposited over the first dielectric layer 210 by suitable depositing processes such as spin-on coating. In an embodiment, the material of the photoresist layer 220 is further treated with a soft baking process and a hard baking process. Then, a portion of the material of the photoresist layer 220 is exposed to a radiation beam, such as an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, and an ion beam. Afterwards, the photoresist layer 220 is developed by using a developer.

Figure 6:
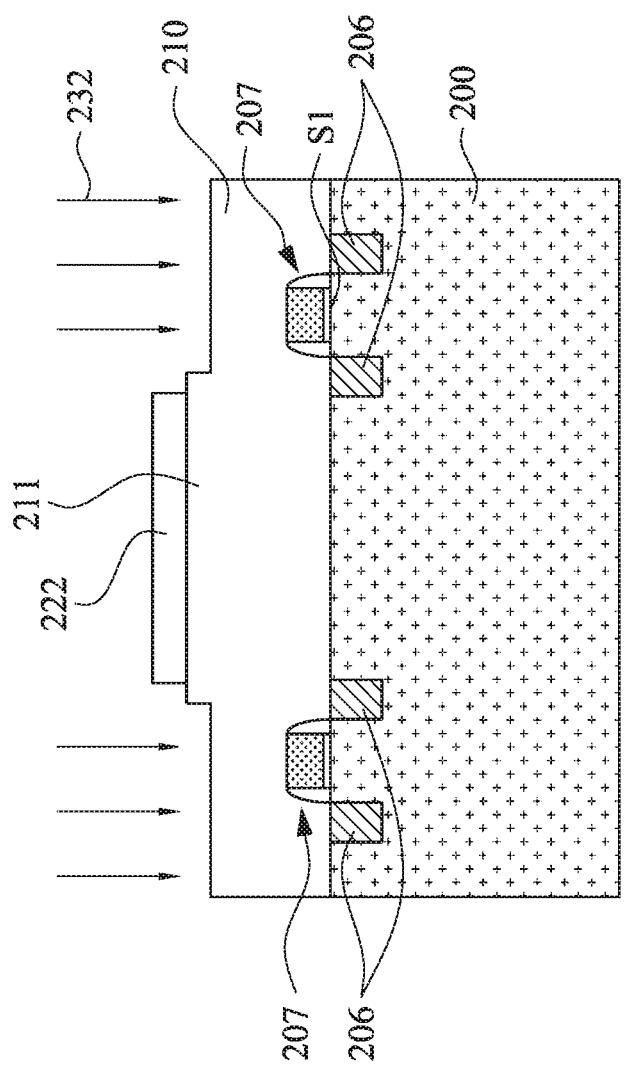

Reference is made to FIG. 1A, FIG. 5 and FIG. 6. At operation 120, the first dielectric layer is etched using the first photoresist layer as a mask. In some embodiments of the operation 120, an etching operation 230 is performed, such that a portion of the first dielectric layer 210 that is exposed from the photoresist layer 220 is removed, and the other portion (e.g., a portion 211) of the first dielectric layer 210 under the photoresist layer 220 remains. The etching operation 230 may be performed by a dry etching such as anisotropic reactive ion etching (RIE). In some embodiments, the first dielectric layer 210 is etched such that the portion 211 of the first dielectric layer 210 underlying the photoresist layer 220 protrudes the remaining portion of the first dielectric layer 210.

Reference is made to FIG. 1B, FIG. 5 and FIG. 6. At operation 122, the first photoresist layer is trimmed to form a second photoresist layer. In some embodiments of the operation 122, the photoresist layer 220 is subjected to an etching operation, such that the photoresist layer 220 is trimmed to form a smaller photoresist layer 222. In some embodiments, the etching operation may be formed by using a plasma etching operation or a laser operation. In certain embodiments, the plasma etching operation is performed using HBr, $Cl_2$ and $O_2$. For example, the plasma etching operation is performed under the following conditions: a flow rate of $Cl_2$ at 10 to 500 sccm, a flow rate of $O_2$ at 1 to 50 sccm, a flow rate of HBr at 10 to 500 sccm, a chamber temperature of about 0° C. to about 100° C., a RF power from about 100 to about 1000 Watts, and a chamber pressure between about 3 mTorr and about 500 mTorr for a period of about 5 seconds to about 200 seconds. A proper trimming rate is achieved under such conditions and damages on the photoresist layer 220 may be prevented. The etching operation is performed on edge portions of the photoresist layer 220, such that the edge portions of the photoresist layer 220 are removed. Edge portions of the portion 211 of the first dielectric layer 210 are exposed from the photoresist layer 222.

Figure 7:
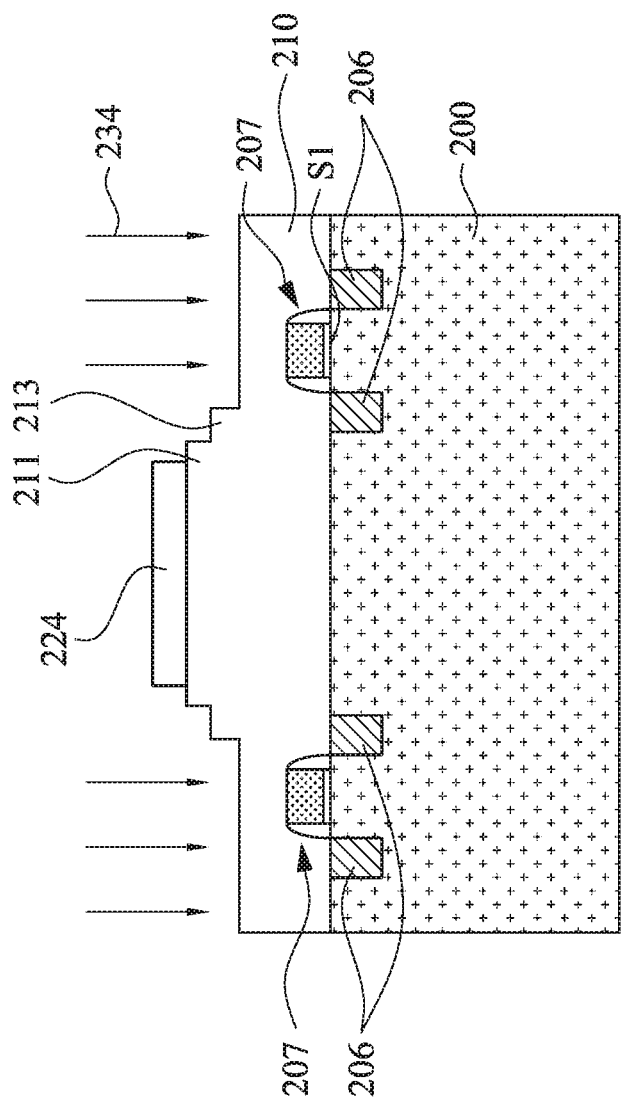

Reference is made to FIG. 1B, FIG. 6 and FIG. 7. At operation 124, similar to the operation 120, the first dielectric layer is etched using the second photoresist layer as a mask. In some embodiments of the operation 124, an etching operation 232 is performed, such that a portion of the first dielectric layer 210 that is exposed from the photoresist layer 222, including the edge portions of the portion 211 of the first dielectric layer 210, is removed, and the other portion of the first dielectric layer 210 underlying the photoresist layer 222 remains. The etching operation 232 using the photoresist layer 222 as the mask is similar to the etching operation 230 using the photoresist layer 220 as the mask. After the etching operation 232 is performed, a portion 213 is formed between the portion 211 and the remaining dielectric layer 210, and the portions 211 and 213 form two layers of a top-flat pyramid structure, in which the portion 211 is smaller than the portion 213. In some embodiments, a time of the etching operation 232 or any other process parameters may be controlled, such that the edge portions of the portion 211 of the first dielectric layer 210 and the first dielectric layer 210 beside the portion 211 are etched without etching the first dielectric layer 210 directly under the portion 211. In other embodiments, the time of the etching operation 232 or any other process parameters may be controlled, such that the edge portions of the portion 211 of the first dielectric layer 210, the first dielectric layer 210 beside the portion 211 and the first dielectric layer 210 directly underlying the portion 211 are etched. The time of the etching operation 232 or any other process parameters is adjusted to determine a height of each of the portions 211 and 213.

Reference is made to FIG. 1B, FIG. 6 and FIG. 7. At operation 126, similar to the operation 122, the second photoresist layer is trimmed to form a third photoresist layer. In some embodiments of the operation 126, the photoresist layer 222 is subjected to an etching operation, such that the photoresist layer 222 is trimmed to form a smaller photoresist layer 224. The etching operation for forming the photoresist layer 224 is similar to the techniques used for forming the photoresist layer 222, and may not be repeated herein. The etching operation is performed on edge portions of the photoresist layer 222, such that the edge portions of the photoresist layer 222 are removed. Edge portions of the portions 211 and 213 of the first dielectric layer 210 are exposed from the photoresist layer 224.

Figure 8:
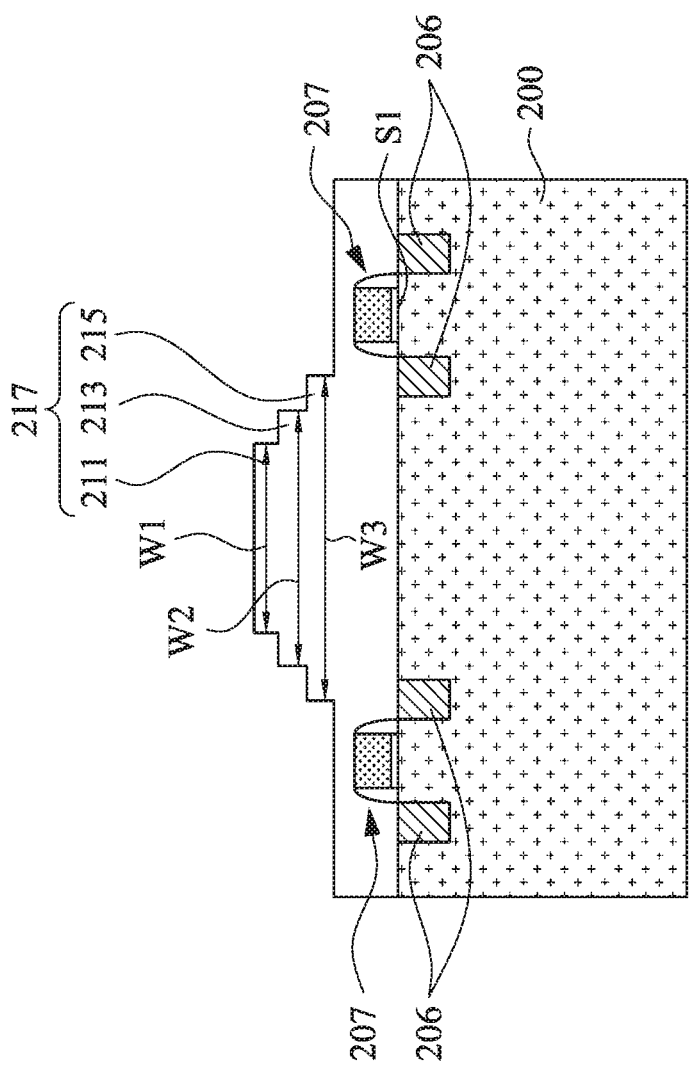

Reference is made to FIG. 1B, FIG. 7 and FIG. 8. At operation 128, similar to the operation 124, the first dielectric layer is etched using the second photoresist layer as a mask. In some embodiments of the operation 128, an etching operation 234 is performed, such that a portion of the first dielectric layer 210 that is exposed from the photoresist layer 224, including the edge portions of the portions 211 and 213 of the first dielectric layer 210, is removed, and the other portion of the first dielectric layer 210 underlying the photoresist layer 224 remains. The etching operation 234 using the photoresist layer 224 as the mask is similar to the etching operation 232 using the photoresist layer 222 as the mask. After the etching operation 234 is performed, a portion 215 is formed between the portion 213 and the remaining first dielectric layer 210, and the portions 211, 213 and 215 form a top-flat pyramid structure 217 having three layers, in which the portion 211 is smaller than the portion 213, and the portion 213 is smaller than the portion 215. Similar to the etching operation 232, the time of the etching operation 234 or any other process parameters is adjusted to determine a height of each of the portions 211, 213 and 215. The formation of the top-flat pyramid structure 217 substantially uses the same photoresist layer (or mask), in which the photoresist layer is sequentially trimmed to form different layers of the top-flat pyramid structure 217 having different dimensions (e.g., widths).

The top-flat pyramid structure 217 will be used as a stencil for forming the reflective element in the subsequent operations, and thus the profile of the top-flat pyramid structure 217 may have an impact on an efficiency of light-recycling. The embodiments of FIG. 8 show the top-flat pyramid structure 217 having three layers (i.e., the portions 211, 213 and 215), while other embodiments may provide a top-flat pyramid structure having other numbers of the layers. The number of the layers of the top-flat pyramid structure 217 may be changed according to requirements and design of the reflective element formed subsequently. In some embodiments, a top-flat pyramid structure having at least two layers is formed from the first dielectric layer 210. A pyramid structure having merely one layer may result in an unsatisfactory efficiency of light-recycling. In other embodiments, a width W of the portion 211 may be at least 30% of a pixel width (which is defined later). The width W1 of the portion 211 (i.e. a length of a flat top portion of the top-flat pyramid structure 217) will affect a focus of the reflective element, and the width W1 equal to or greater than 30% of the pixel width is advantageous to form the reflective element having the desired focus, such that the light can be reflected back toward the photodiode layer (i.e., the semiconductor substrate 200). Furthermore, the portion 213 may have a width W2, the portion 215 may have the width W3, in which the width W1 may be about 5% to about 95% of the width W2, and the width W2 may be about 5% to about 95% of the width W3, in some embodiments. The widths W1, W2 and W3 define a dimension of the reflective element, such that a projection of the reflective element on a pixel region may cover at least 50% of an area of the pixel region, in some embodiments. When the reflective element covers at least about 50% of the area of the pixel region, the efficiency of light-recycling is satisfactory.

Figure 9:
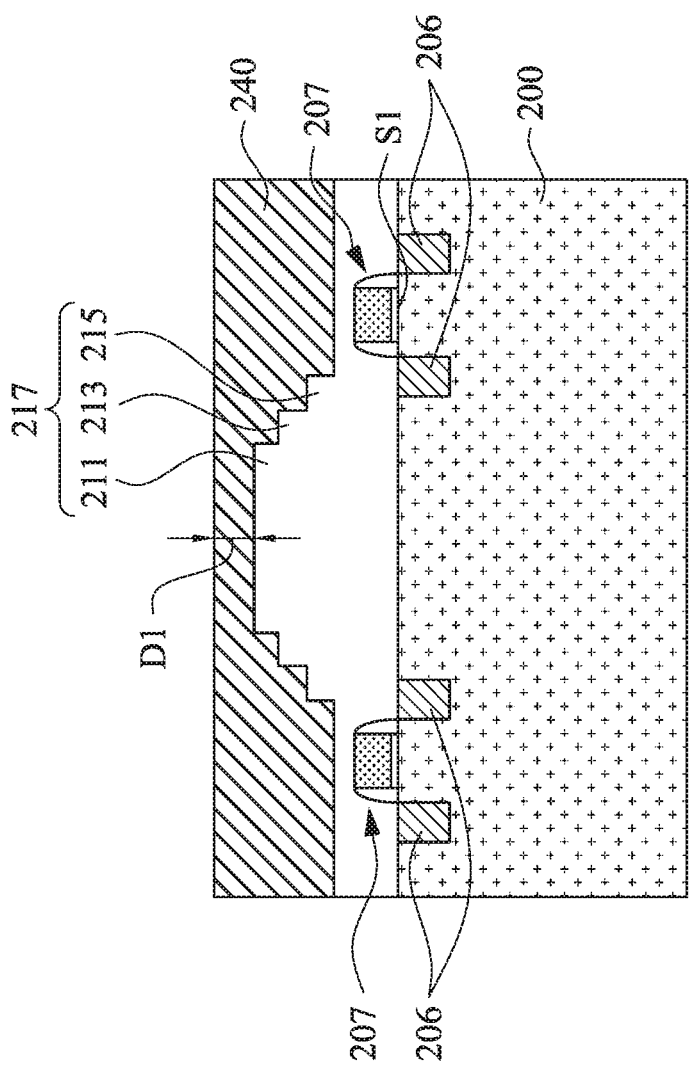

Reference is made to FIG. 1B and FIG. 9. At operation 130, the reflective element is formed over the first dielectric layer. In some embodiments of the operation 130, a reflective layer 240 is deposited over the top-flat pyramid structure 217 and the first dielectric layer 210. In some embodiments, the reflective layer 240 is formed by a material that is different from the material of the first dielectric layer 210. In alternative embodiments, the reflective layer 240 is formed from a metal or a metal alloy. For example, the metal may be copper, silver, nickel, aluminum, titanium, molybdenum or tin, and the metal alloy may be any combination of the metal. In some embodiments, the reflective layer 240 may be deposited using CVD, PVD, LPCVD or any other suitable deposition process. In some embodiments, a planarization operation may then be performed, such that a surface of the deposited reflective layer 240 may be substantially flat. In some embodiments, a distance D1 between a top surface of the reflective layer 240 and a top surface of the portion 211 is at least about 10 Å. The distance D1 determines the least thickness of the reflective element formed subsequently, and when the distance D1 is smaller than about 10 Å, damages may occur on the thinnest place of the reflective layer 240 after the planarization operation is performed. The damages may cause a defect of the reflective element, and the light passing through the photodiode layer may not be recycled.

Figure 10:
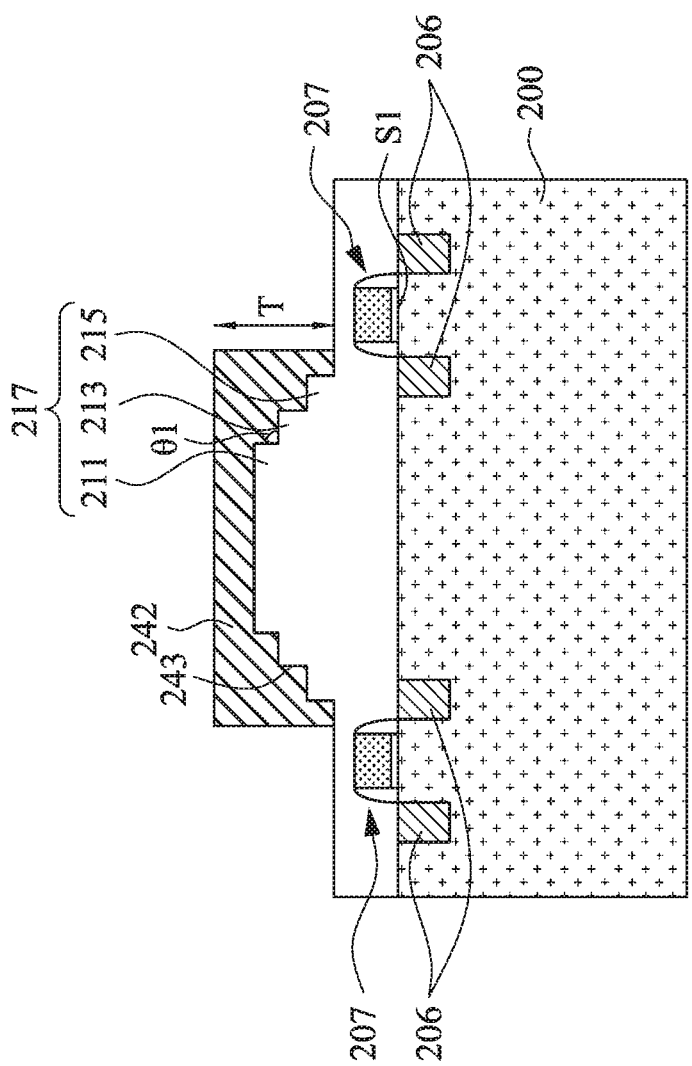

Reference is made to FIG. 10. The operation 130 further includes patterning the reflective layer 240, such that a reflective element 242 is formed. The reflective element 242 is formed according to the top-flat pyramid structure 217. As a result, the reflective element 242 may have a U-shape profile, and an inner sidewall 243 of the reflective element 242 may have a zigzag profile corresponding to the multiple layers (i.e., the portions 211, 213 and 215) of the top-flat pyramid structure 217. The U-shape is beneficial to collect and reflect the light back toward the semiconductor substrate 200. In some embodiments, an included angle θ1 of each zigzag fold of the inner sidewall 243 may be equal to about 90° and smaller than about 180°. The included angle θ1 may be adjusted to control an angle of reflection, so as to achieve a satisfactory efficiency of light-recycling. In some embodiments, a thickness T of the reflective element 242 may be in a range from about 50 Å to about 2000 Å. The reflective element 242 having the thickness in such range may have a proper radian, such that the reflective element 242 has a satisfactory efficiency of light-recycling.

Figure 11:
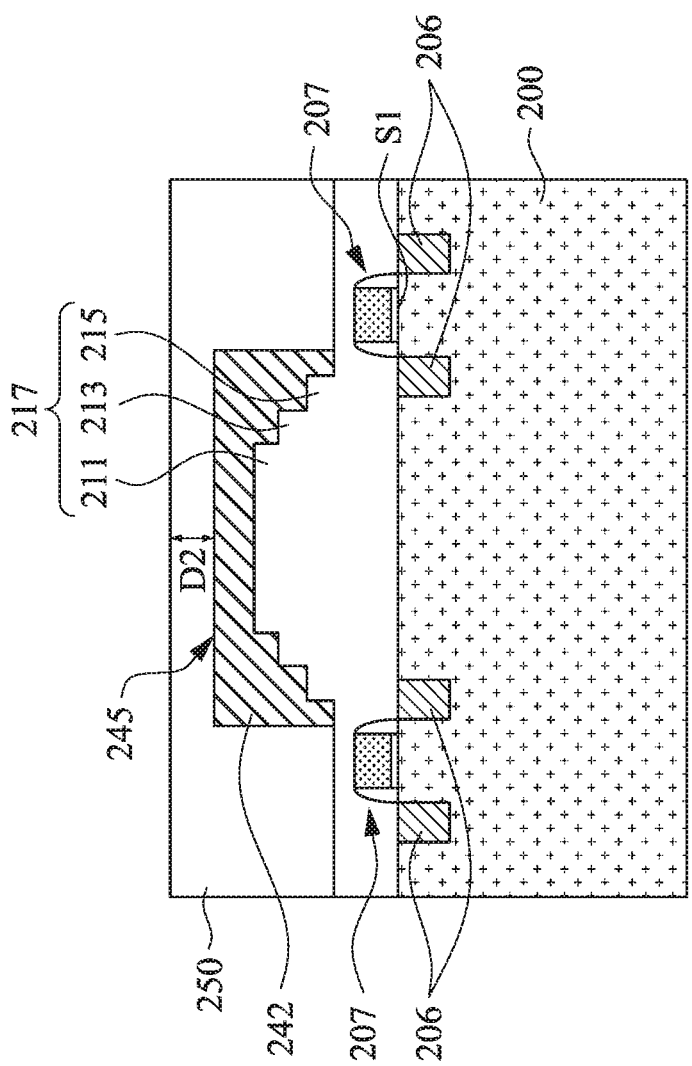

Reference is made to FIG. 1B and FIG. 11. At operation 132, a second dielectric layer is deposited over the reflective element and the first dielectric layer. In some embodiments of the operation 132, a second dielectric layer 250 may be formed by using the same method for forming the first dielectric layer 210. The second dielectric layer 250 separates the reflective element 242 (which may be inherently conductive) from one or more conductive features formed over the reflective element 242 in subsequent operations. As a result, a distance D2 between a top surface of the second dielectric layer 250 and a surface 245 of the reflective element 242 is in a range from about 500 Å to about 3000 Å. When the distance D2 is smaller than about 500 Å, a risk of corona discharge may occur in the reflective element 242. When the distance D2 is greater than about 3000 Å, the subsequent contact-forming operation may be challenging because of a great aspect ratio of the contact via.

Figure 12:
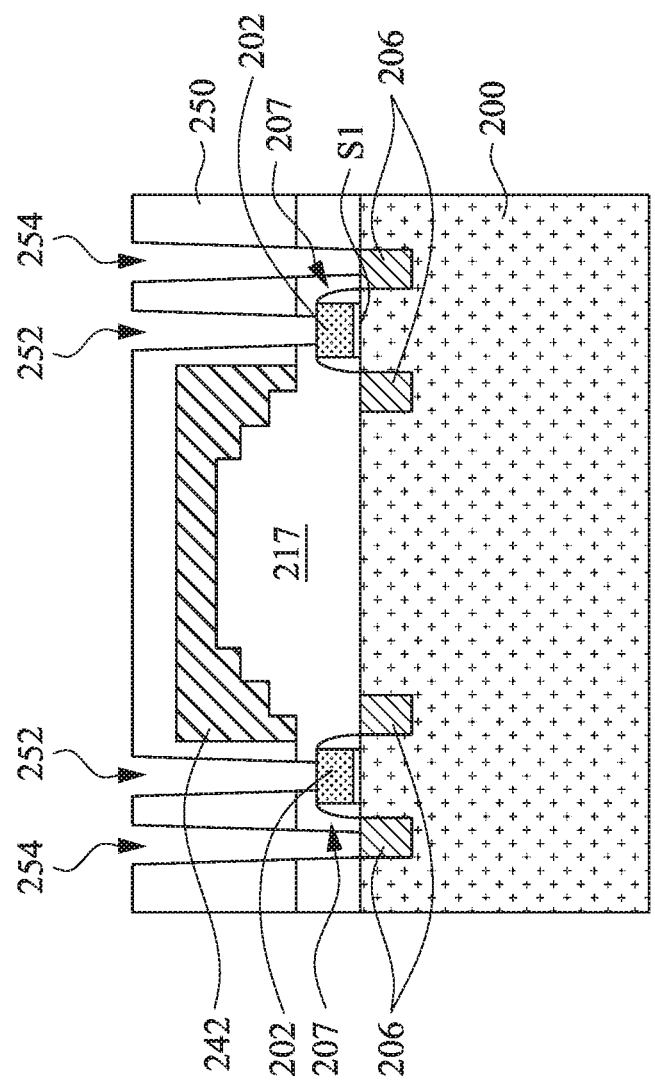
Figure 13:
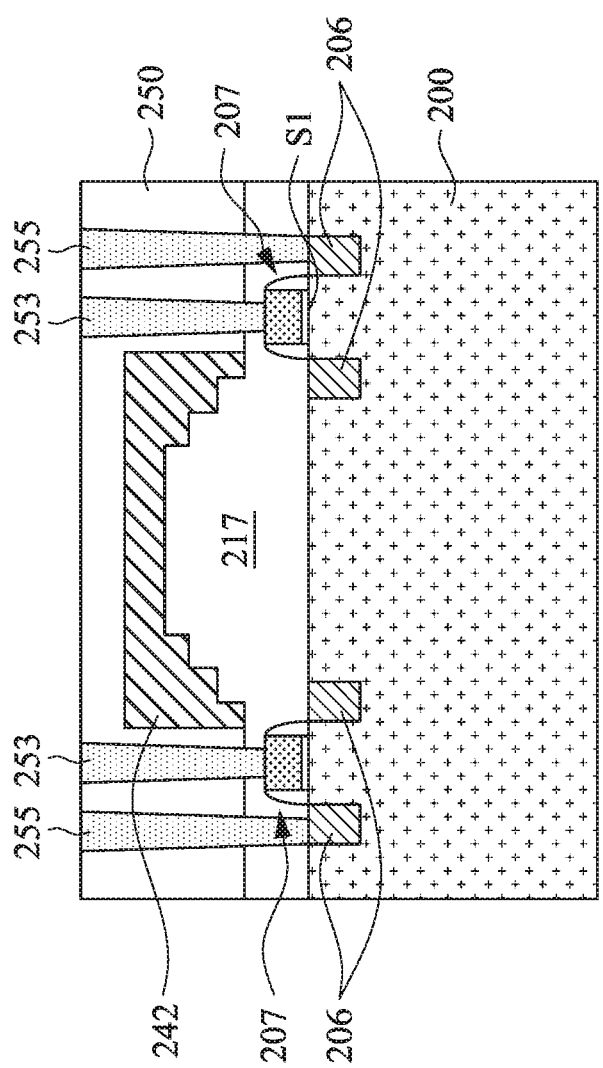

Reference is made to FIG. 1B, FIG. 12 and FIG. 13. At operation 134, contact vias are formed through the first and second dielectric layers. In some embodiments of the operation 134, contact holes 252 are formed such that a top surface of the gate electrode layer 202 of each of the semiconductor devices 207 is exposed. Furthermore, contact holes 254 are formed such that top surfaces of the source/drain regions 206 are exposed. Then, a conductive material is filled into the contact holes 252 and 254 to form contact vias 253 and 255. The conductive material includes but is not limited to tungsten or tungsten alloys. Alternatively, other metals such as copper, aluminum, or the like, may also be used. A CMP operation may then be performed to remove excess conductive material.

Figure 14:
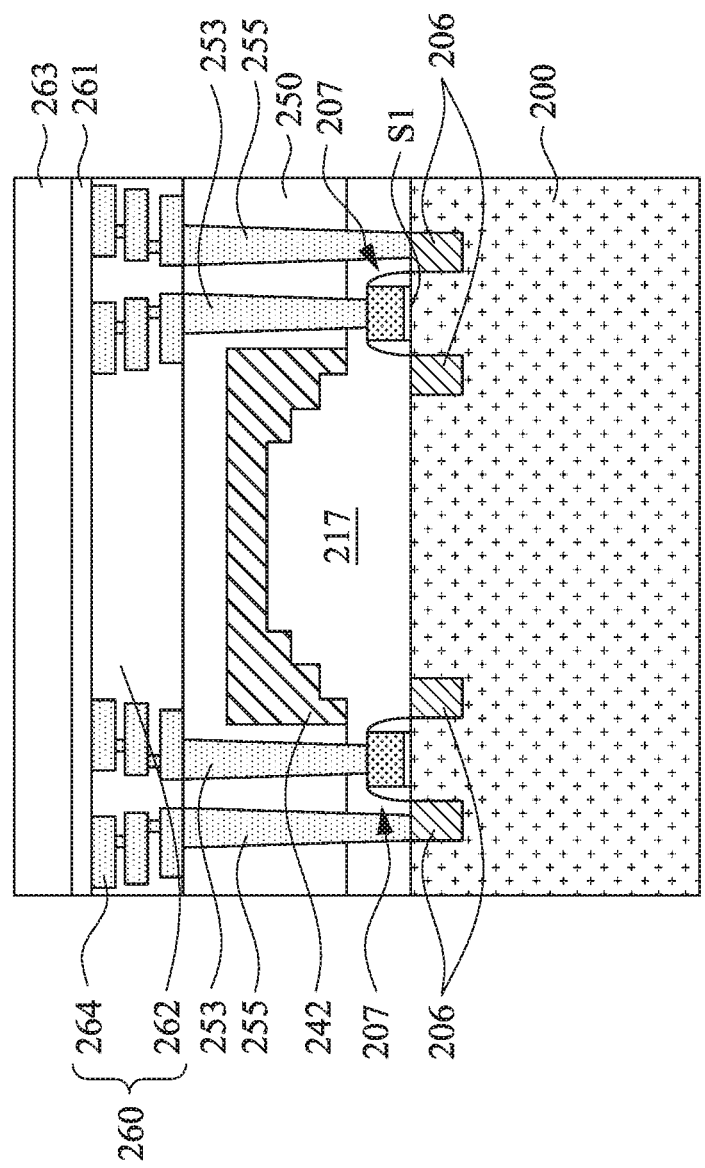

Reference is made to FIG. 1B and FIG. 14. At operation 136, an interconnection structure containing metallization features is formed, in which the metallization features are electrically coupled to the semiconductor devices through the contact vias. In some embodiments of the operation 136, an interconnect structure 260 is formed over the first and second dielectric layers 210 and 250. The interconnect structure 260 includes a third dielectric layer 262 and metallization features 264 in the third dielectric layer 262, and the metallization features 264 are electrically coupled to the semiconductor devices 207 and source/drain regions 206 by contact vias 253 and 255 extending through the first and/or second dielectric layers 210 and 250. In some embodiments, a material of the third dielectric layer 262 is similar to the material of the first and second dielectric layers 210 and 250. In some embodiments, the metallization features 264 are formed of a conductive material, such as copper, aluminum, tungsten, gold, or some other conductive material. Furthermore, in some embodiments, the metallization features 264 are formed based on a dual-damascene process and a single-damascene process that are not restricted to copper, such that other materials may be used in place of copper. After a topmost layer of the metallization features 264 is formed, a CMP operation may be further implemented to expose the topmost layer of the metallization features 264 from the third dielectric layer 262.

Then, a buffer layer 261 is formed on the interconnect structure 260, in accordance with some embodiments. The buffer layer 261 may include a dielectric material such as silicon oxide. Alternatively, the buffer layer 261 may include silicon nitride. The buffer layer 261 may be deposited by CVD, PVD, or other suitable techniques. The buffer layer 261 may be planarized to form a smooth surface by a CMP process.

Afterwards, a substrate 263 is bonded with the semiconductor substrate 200 through the buffer layer 261. In some embodiments, the substrate 263 is a carrier substrate that is similar to the semiconductor substrate 200 and includes a silicon material. Alternatively, the carrier substrate 263 may include a glass substrate or another suitable material. Alternatively, the substrate 263 may be a silicon carbide (SiC) device wafer where various conductive, non-conductive, dielectric or insulation features are formed. The substrate 263 may be bonded to the semiconductor substrate 200 by molecular forces (direct bonding), optical fusion bonding, metal diffusion bonding, anodic bonding, or by other suitable bonding techniques. The buffer layer 261 provides electrical isolation between the semiconductor substrate 200 and the substrate 263. When the substrate 263 is the carrier substrate, it provides protection for the various features formed on the front side S of the semiconductor substrate 200. The carrier substrate 263 also provides mechanical strength and support for processing a backside S3 of the semiconductor substrate 200.

After the substrate 263 is bonded, a thinning process is then performed to thin the semiconductor substrate 200 from the backside S3 of the semiconductor substrate 200. The thinning process may include a mechanical grinding process. Afterwards, an etching chemical may be applied over the backside S3 of the semiconductor substrate 200 to further thin the semiconductor substrate 200 to a thickness which is on the order of a few microns. For example, the thickness of the semiconductor substrate 200, after being thinned, is in a range from about 1 μm to about 100 μm.

Figure 15:
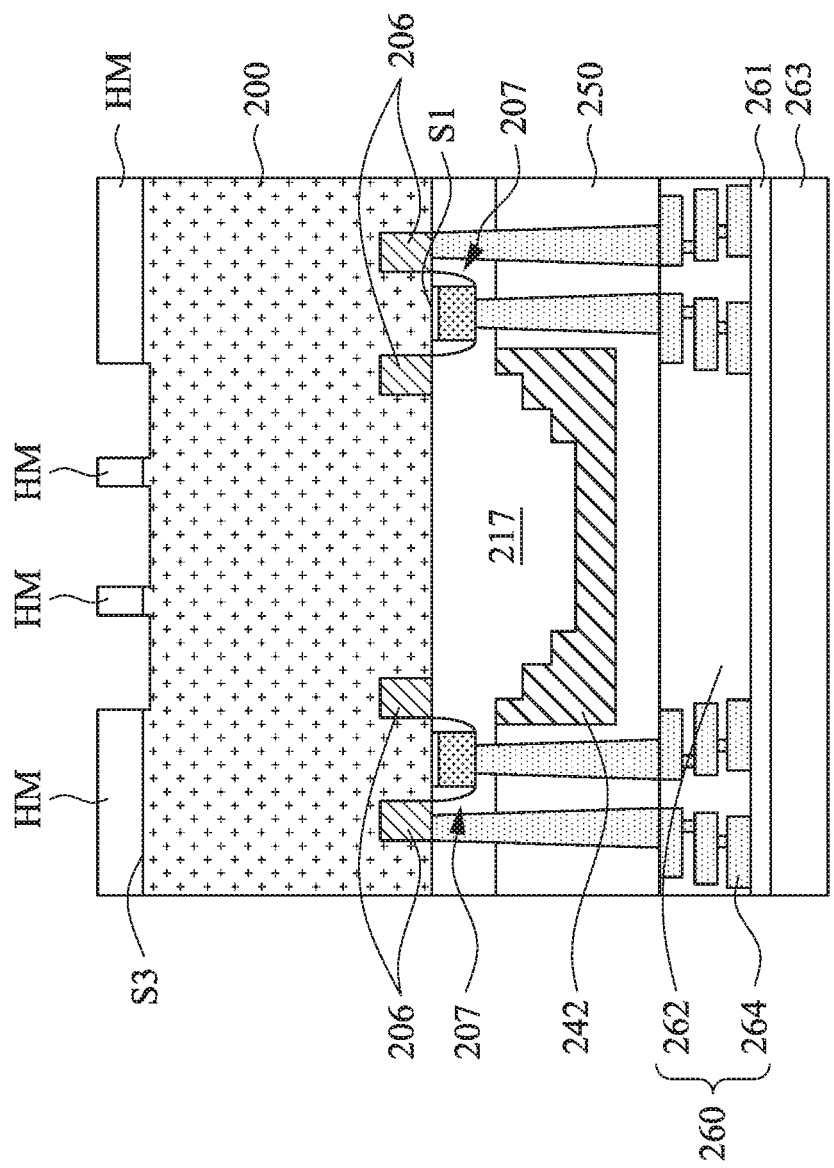
Figure 16:
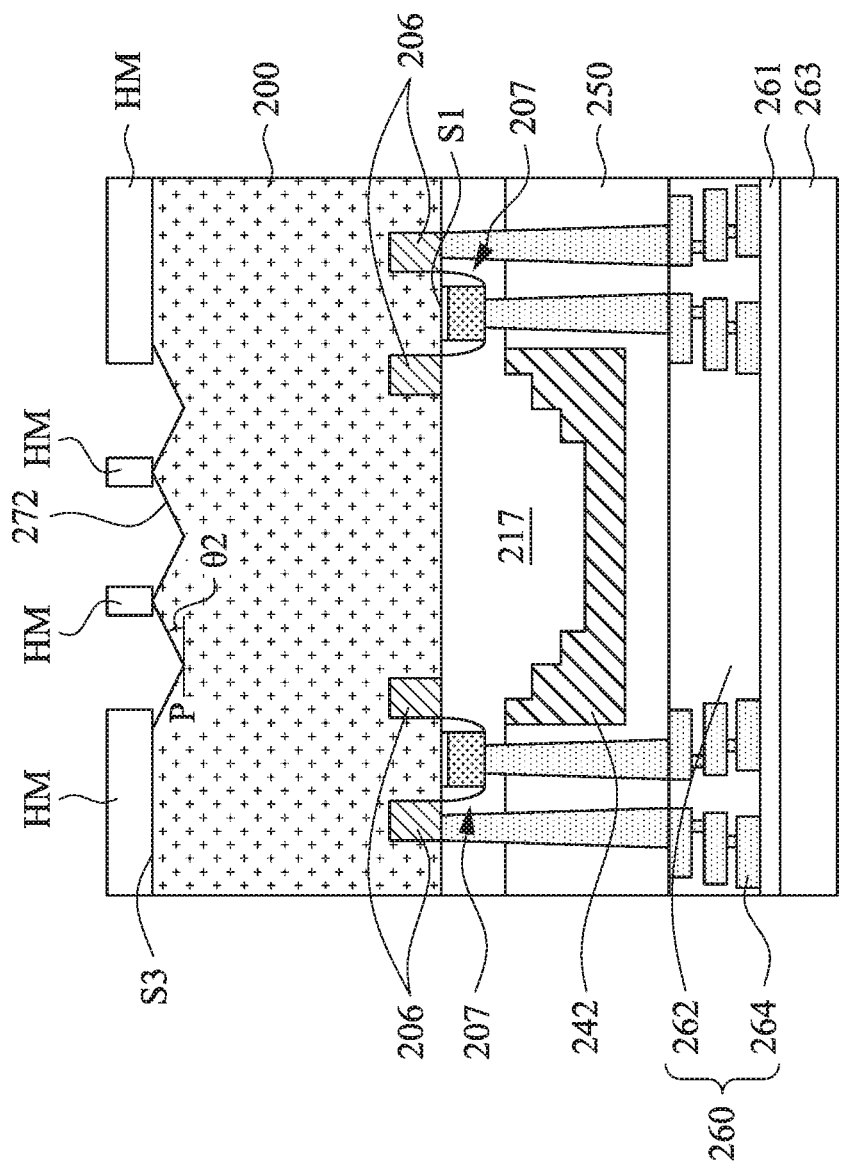

Reference is made to FIG. 1C, FIG. 15, FIG. 16 and FIG. 17. At operation 138, a backside of the semiconductor substrate is etched to form trenches. In some embodiments of the operation 138, the backside S3 of the semiconductor substrate 200 is etched to form a microstructure, and then etched to form the trenches. As shown in FIG. 15, a hardmask layer (not shown) is formed on the backside S3 of the semiconductor substrate 200, and is patterned (or etched) to form a hardmask HM from which a portion of the semiconductor substrate 200 is exposed. In some embodiments, the exposed portion of the semiconductor substrate 200 is slightly recessed during the operation of etching the hardmask layer. Then, as shown in FIG. 16, a wet etching is performed using the hardmask HM, in which the semiconductor substrate 200 is etched according to its crystal orientation such that a microstructure 272 is formed. A location of the microstructure 272 corresponds to the location of the reflective element 242. In some embodiments, upper and lower portions of the microstructure 272 are tapered or rounded to obtain a wave pattern as shown in FIG. 16. In some embodiments, a sidewall of the microstructure 272 and a direction or a plane P form an included angle θ2. In some embodiments, the plane P is substantially parallel with a surface of the front side S1 of the semiconductor substrate 200. In some embodiments, the included angle 92 is between about 20° and about 70°, but the disclosure is not limited to this. In some embodiments, the microstructure 272 can be continuous structures and include a wave profile as shown in FIG. 16. In some embodiments, the microstructure 272 can include discrete structure spaced apart from each other by the semiconductor substrate 200. Alternatively, the microstructure 272 may not be formed, and trenches of FIG. 17 may be formed right after the semiconductor substrate is thinned in other embodiments.

Figure 17:
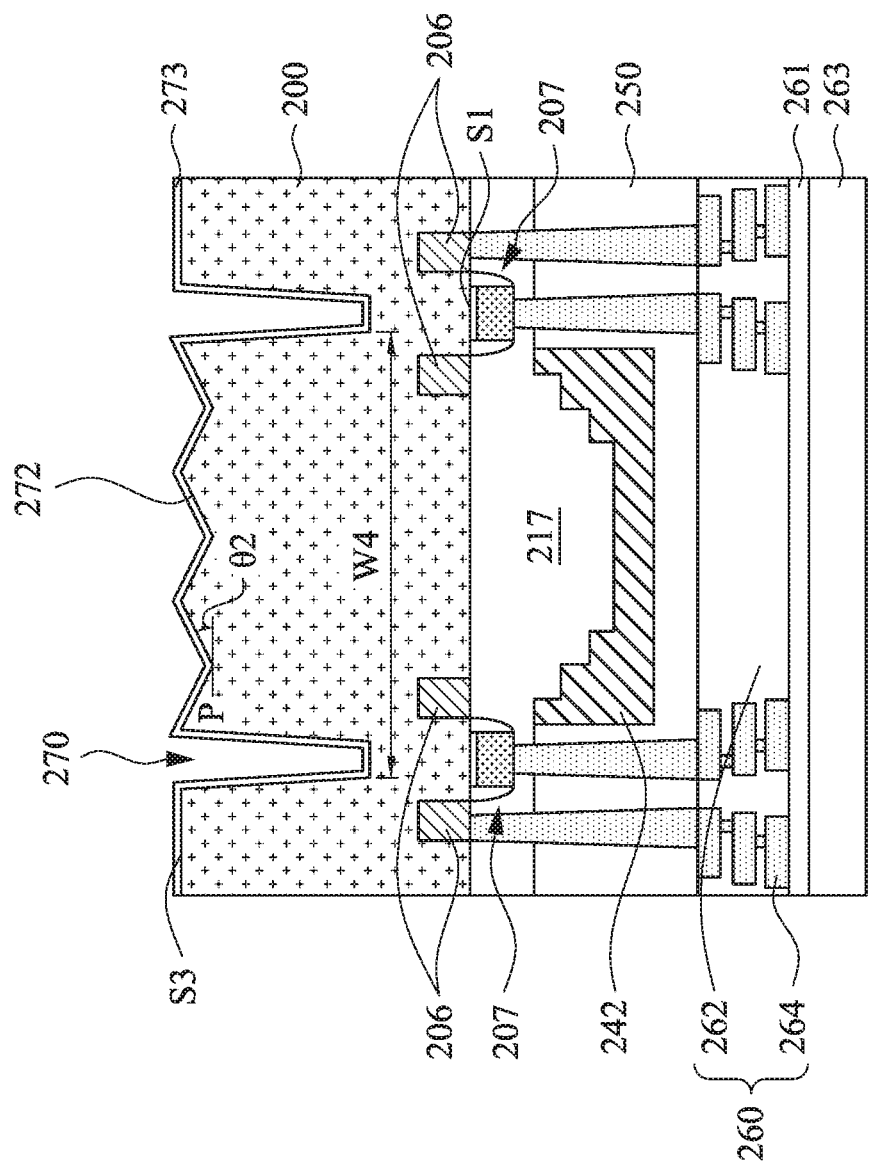

Please refer to FIG. 17, trenches 270 are formed by etching the backside S3 of the semiconductor substrate 200 using a dry etching process after the microstructure 272 is formed. The hardmask HM is removed before the formation of the trenches 270, and another mask may be formed for forming the trenches 270. For example, the dry etching may be implemented by using any suitable gases such as an oxygen containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases (Ar and/or $CH_4$) and/or plasmas, and/or combinations thereof. In some embodiments, the dry etching process utilizes an $O_2$ plasma treatment and/or an $O_2/N_2$ plasma treatment. Furthermore, the dry etching process can be performed for a suitable duration under certain pressure range. Some process parameters such as etching durations and/or etch rate are adjustable to control a depth of the trenches 270. In some embodiments, a position of each of the trenches 270 corresponds to a position of the semiconductor devices 207. In certain embodiments, the trenches 270 are aligned with the semiconductor devices 207 in one-to-one manner. Alternatively, the position of the trenches 270 is staggered from the position of the semiconductor devices 207.

After the formation of the trenches 270 and the microstructure 272, the remaining semiconductor substrate 200 may be referred to as the photodiode layer where the light is absorbed and converted into the electrons to generate the electrical signal. In some embodiments, a portion of the semiconductor substrate 200 between the trenches 270 is a light-sensing region (or a pixel region). In some embodiments, a pixel pitch W4 of the pixel region may be also defined by the trench isolations formed subsequently in the trenches 270. For example, the pitch W4 may be in a range from about 0.1 μm to about 100 μm. However, other widths may be applied in other embodiments according to a scale of the image sensor.

Figure 18:
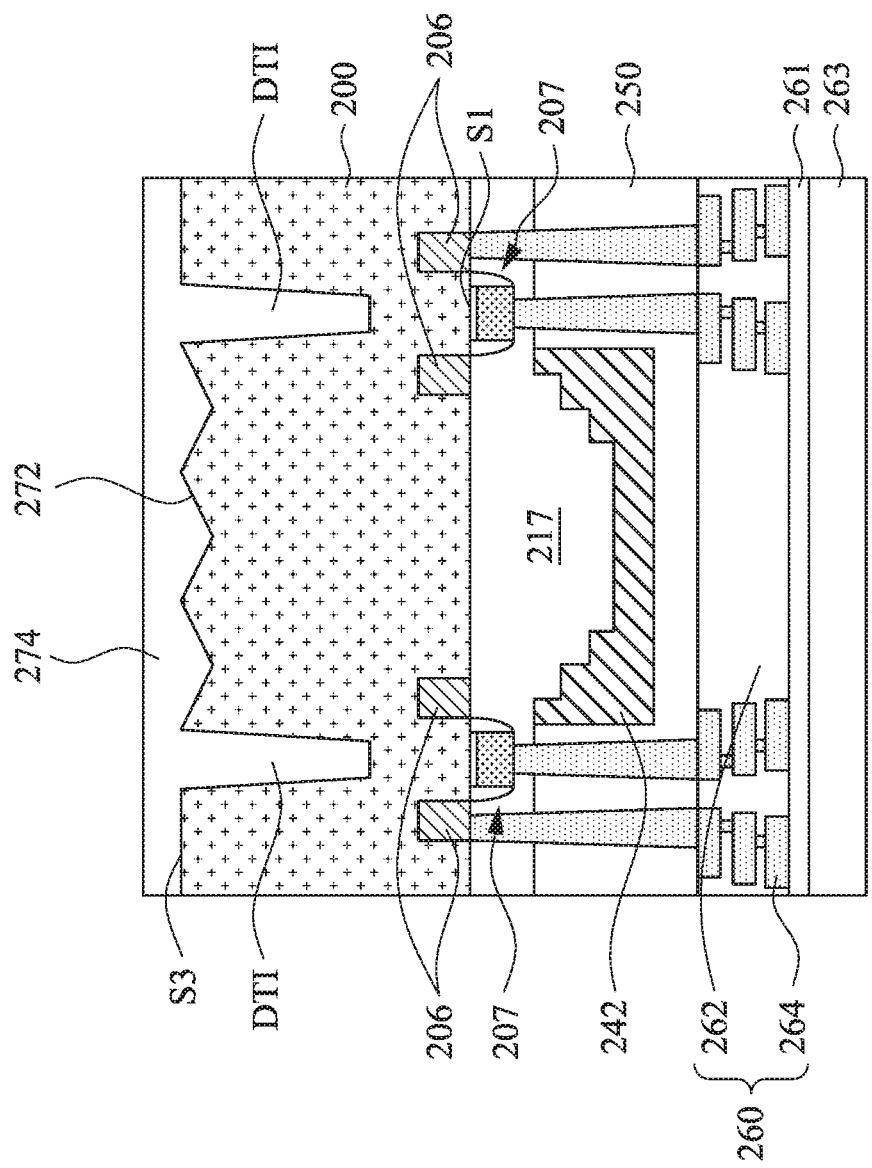

Reference is made to FIG. 1C, FIG. 17 and FIG. 18. After the trenches 270 and the microstructure 272 are formed, an anti-reflective coating (ARC) 273 is conformally deposited on the trenches 270 and the microstructure 272. In some embodiments, the ARC 273 may be deposited by a CVD process or a PVD process. The ARC 273 may be formed of nitrides, oxides, other dielectric materials, a combination thereof or the like. Then, as shown in operation 140, an insulating material is filled into the trenches to form deep trench isolations (DTIs). In some embodiments of the operation 140, the trenches 270 are filled with an insulating material 274, and DTIs are then formed. In some embodiments, the insulating material 274 includes but is not limited to silicon oxide (SiO). Any suitable deposition technique, such as chemical vapor deposition (CVD), can be used to form the DTIs. In other embodiments, the insulating material 274 further fills spaces in the microstructure 272. The incident light may be scattered or diffused by the microstructure 272, and thus the direct incident light is dipped or tilted by the microstructure 272 when entering the semiconductor substrate 200. With the configuration of the microstructure 272, longer light traveling distance is created in the semiconductor substrate 200. The light is trapped in the semiconductor substrate 200, and sensitivity of the image sensor is therefore improved. In further embodiments, the insulating material 274 overfills the trenches 270 and the spaces of the microstructure 272, such that the top surface of the backside S3 of the semiconductor substrate 200 is covered by the insulating material 274. In other embodiments, a planarization process such as CMP can be operated to the insulating material 274 to provide a substantially flat or even surface over the back side S3 of the semiconductor substrate 200, and one or more transmitting layer (not shown) may then be formed over the DTIs and the microstructure 272. In some embodiments, a thickness of the insulating material 274 may be in a range from about 100 Å to about 3000 Å. The ARC 273 and the insulating material 274 act as a buffer layer, and the thinner buffer layer is usually preferred. However, forming the buffer layer with a small thickness may be difficult because of the process limitation. Therefore, the thickness of the insulating material 274 in the aforementioned range is suitable.

Figure 19:
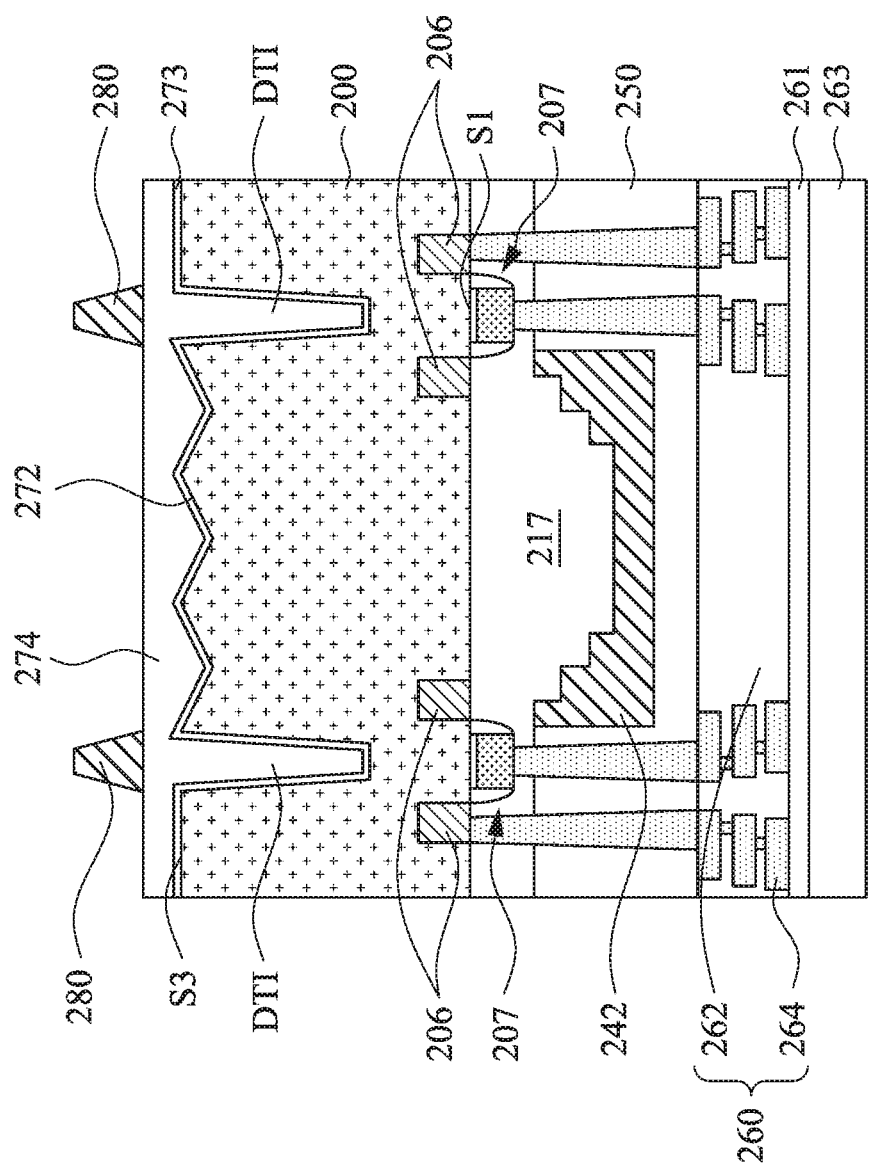

Reference is made to FIG. 1C and FIG. 19. At operation 142, reflective grids are formed over the semiconductor substrate. In some embodiments of the operation 142, reflective grids 280 are formed over the backside S3 of the semiconductor substrate 200. For example, the reflective grids 280 are formed on the insulating material 274. The reflective grids 280 are aligned with the DTIs in a one-to-one manner. In some embodiments, the reflective grids 280 are formed of a metal material, such as aluminum, tungsten, copper, tantalum, titanium, alloys thereof, or combinations thereof. Each of the reflective grids 280 may have a rectangular shape, a reverse trapezoidal shape, reverse triangle shape, or another suitable shape. In some embodiments, each of the reflective grids 280 has a thickness in a range from about 100 Å to about 15000 Å. The reflective grids 280 are formed by a suitable deposition process and then patterned. The deposition process includes electroplating, sputtering, CVD, PVD or other suitable depositing techniques. The CVD process may be a PECVD including ICPECVD, an LPCVD, or an ALD with or without plasma.

In some embodiments, each of the reflective grids 280 has a width in a range from about 10 to about 1000 nm. The width of the reflective grids 280 is substantially equal to or greater than the width of the DTIs to cover the DTs. Therefore, the reflective grids 280 prevent the nearly vertical incident radiation from travelling into the DTIs. The nearly vertical incident radiation that travels into the DTIs may be refracted to adjacent radiation-sensing regions, and undesired photo cross-talk would occur.

Figure 20:
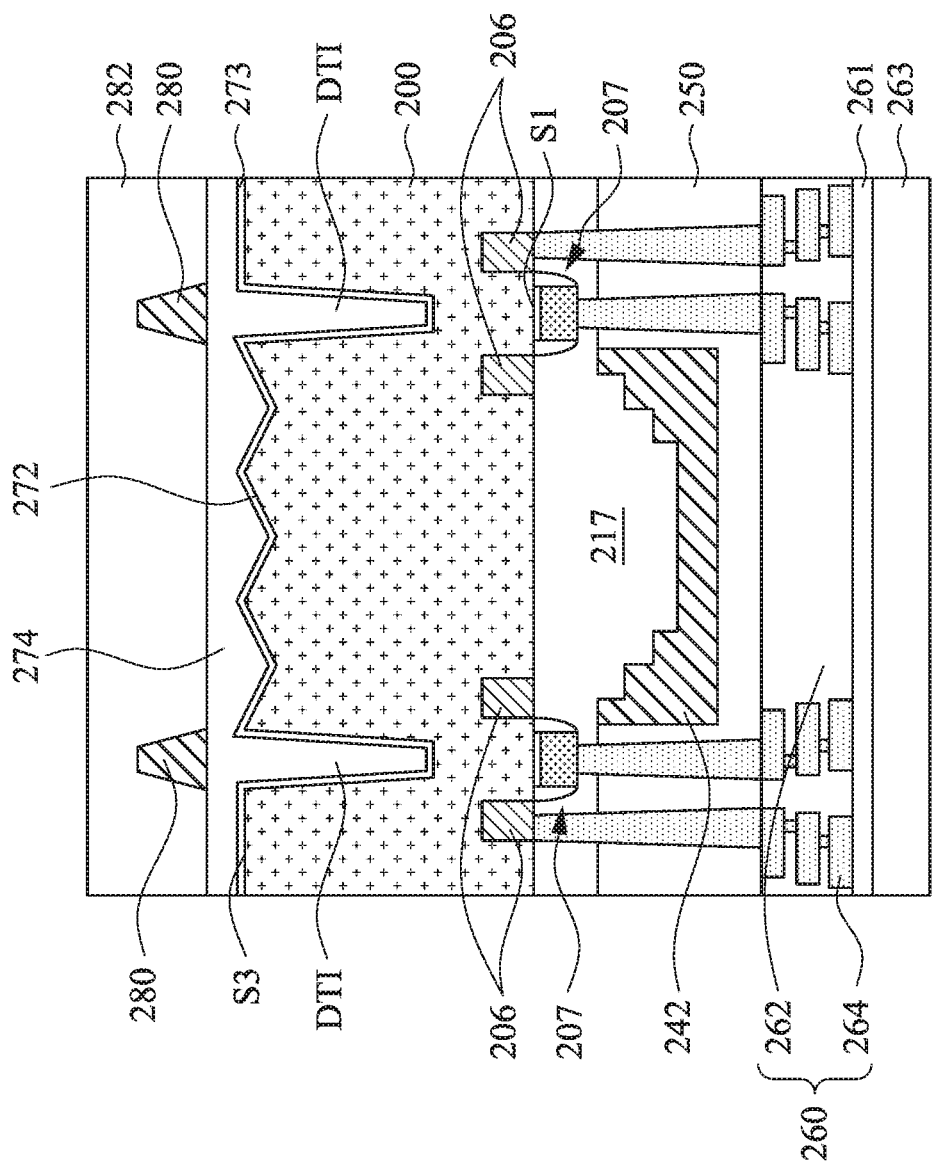

Reference is made to FIG. 1C and FIG. 20. At operation 144, a transparent filling layer is formed over the semiconductor substrate. In some embodiments of the operation 144, a transparent filling layer 282 is deposited over the backside S3 of the semiconductor substrate 200. The transparent filling layer 282 may be made of silicon oxide, silicon nitride, or suitable polymers, and may be formed by suitable techniques, such as CVD, PVD, or combinations thereof. In some embodiments, the transparent filling layer 282 has a thickness greater than that of the reflective grids 280. Accordingly, the transparent filling layer 282 covers the reflective grids 280 and provides a smooth surface. For example, the transparent filling layer 282 has a thickness ranging from about 100 Å to about 15000 Å. In some embodiments, the transparent filling layer 282 functions as an antireflective layer of the image sensor. The antireflective layer reduces reflection of the incident radiation projected toward the backside S3 of the image sensor.

Figure 21:
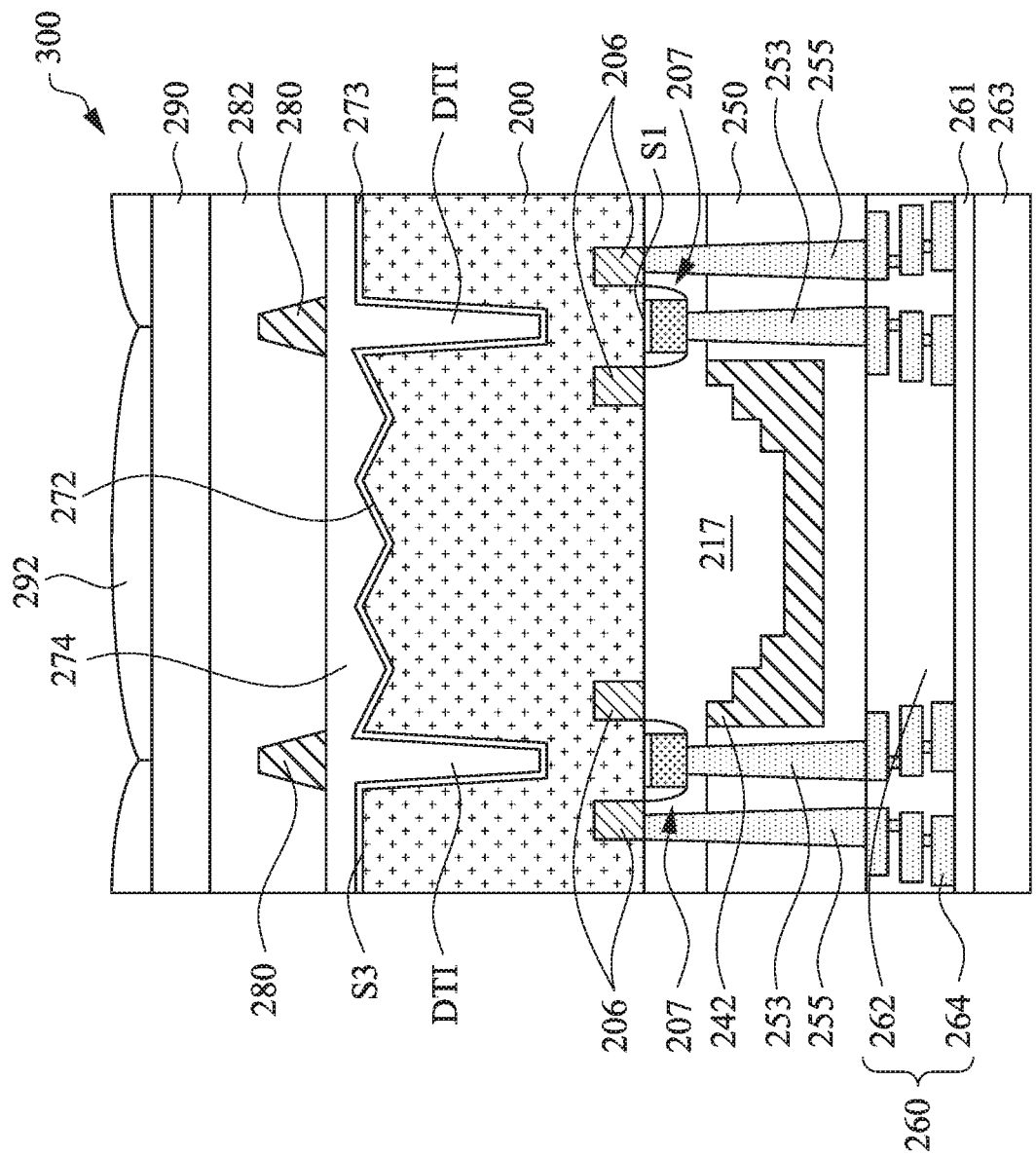

Reference is made to FIG. 1C and FIG. 21. At operation 146, a color filter layer 290 is formed over the transparent filling layer 282. The color filter layer 290 supports the filtering of incident radiation having a particular range of wavelengths, which may correspond to a particular color of light, for example, red, green, or blue. The color filter layer 290 may be used to allow only light having a predetermined color to reach of the light-sensing region. At operation 148, a micro lens layer 292 may be formed over the color filter layer 290 for directing incident radiation toward the light-sensing region, and a back side illumination (BSI) image sensor 300 is then formed. The micro lens layer 292 may be positioned in various arrangements and have various shapes depending on the refractive index of the material used for the micro lens layer 292 and/or the distance between the micro lens layer 292 and the light-sensing regions. Alternatively, the position of the color filter layer 290 and micro lens layer 292 may be reversed such that the micro lens layer 292 may be disposed between the backside S3 of the semiconductor substrate 200 and color filter layer 290.

Figure 22:
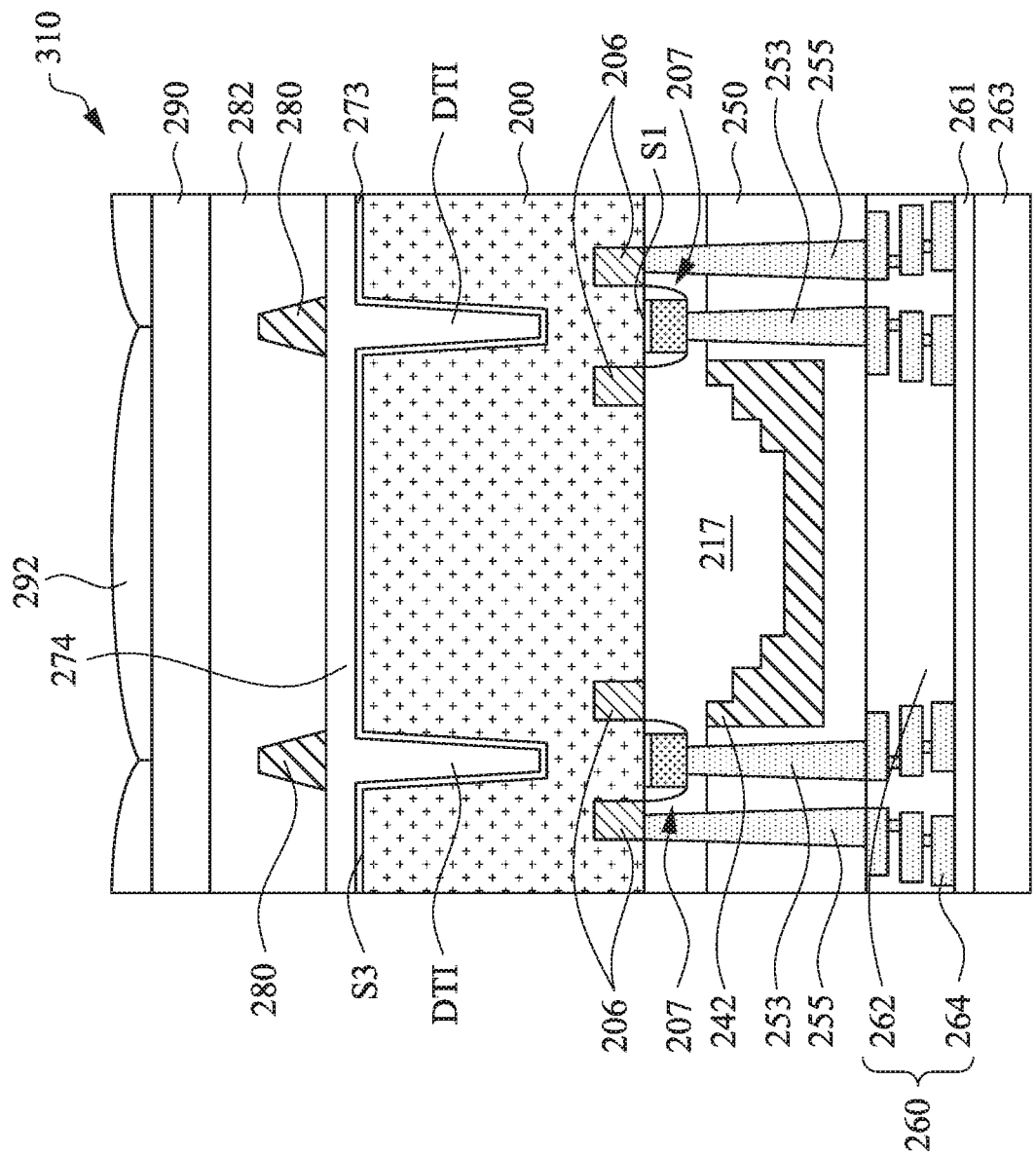
FIG. 22 is a schematic cross sectional view of a BSI image sensor in accordance with other embodiments of the present disclosure.

FIG. 22 is a schematic cross sectional view of a BSI image sensor in accordance with other embodiments of the present disclosure. Elements of FIG. 22 that are same as those shown in FIG. 21 are labelled with the same reference numbers. No microstructure such as the microstructure 272 of FIG. 21 is formed in a BSI image sensor 310. In other words, an interface between the insulating material 274 and the surface of the back side S3 of the semiconductor substrate 200 is relatively flat.

Figure 23:
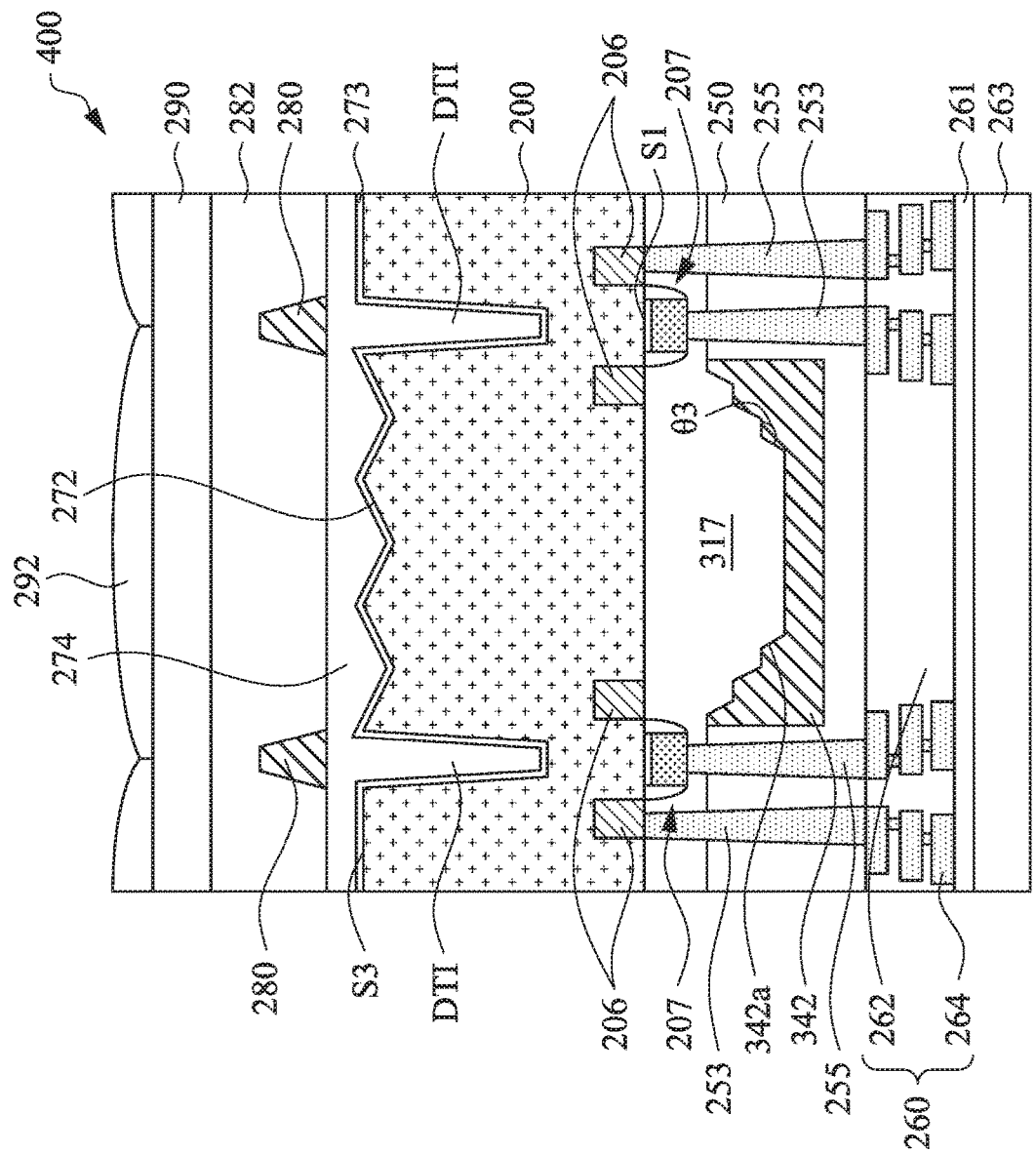
FIG. 23 is a schematic cross sectional view of a BSI image sensor in accordance with another embodiment of the present disclosure.

FIG. 23 is a schematic cross sectional view of a BSI image sensor in accordance with another embodiment of the present disclosure. Elements of FIG. 23 that are same as those shown in FIG. 21 are labelled with the same reference numbers. In a BSI image sensor 400, a top-flat pyramid structure 317 has multiple layers each of which has tapered sidewalls 342a. The tapered sidewalls 342a may be formed by adjusting parameters for etching the first dielectric layer 210. Furthermore, a reflective element 342 is formed based on a profile of the top-flat pyramid structure 317, and thus the reflective element 342 has an inner sidewall with a zigzag profile, and each zigzag fold of the zigzag profile has an included angle θ3 that is greater than 90°.

Figure 24:
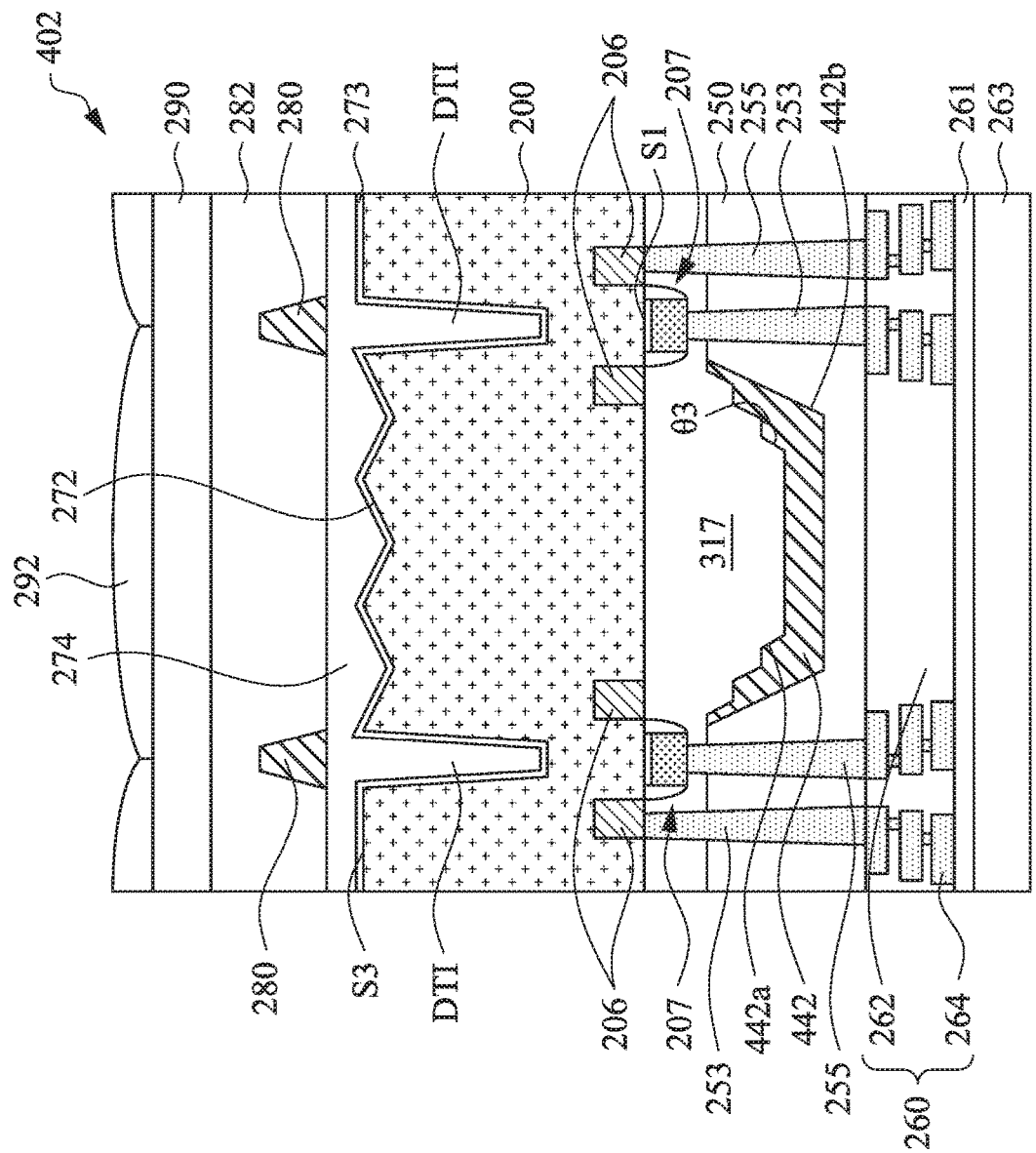
FIG. 24 is a schematic cross sectional view of a BSI image sensor in accordance with a further embodiment of the present disclosure.

FIG. 24 is a schematic cross sectional view of a BSI image sensor in accordance with a further embodiment of the present disclosure. Elements of FIG. 24 that are same as those shown in FIG. 21 are labelled with the same reference numbers. In a BSI image sensor 402, a reflective element 442 has an inner sidewall 442a that is similar to the inner sidewall 342a of FIG. 23. However, an outer sidewall 442b of the reflective element 442 is tapered. In some embodiments, a slope of the outer sidewall 442b may be substantially close to a slope of the tapered inner sidewall 442a. In other embodiments, the slope of the out sidewall 442b is different from the slope of the tapered inner sidewall 442a.

Figure 25:
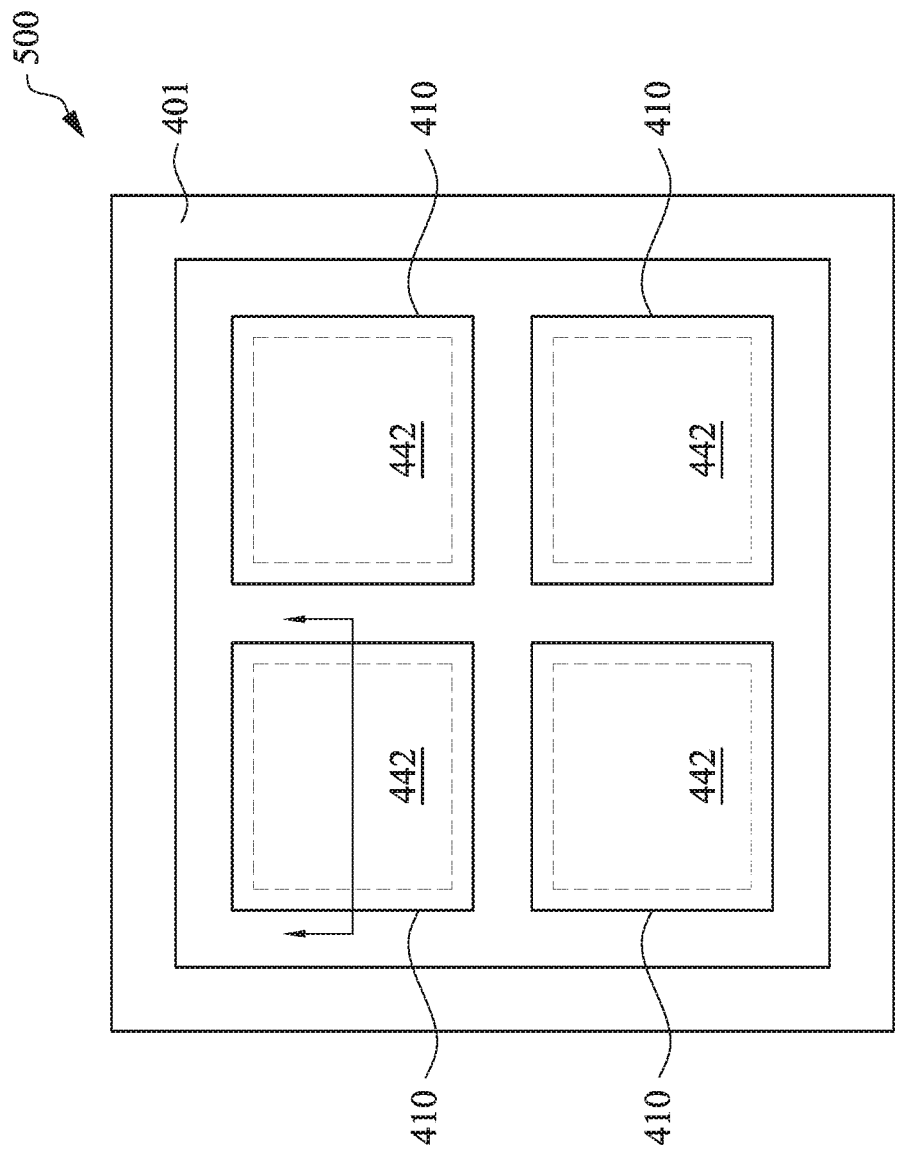
FIG. 25 is a schematic top view of a BSI image sensor.

FIG. 25 is a schematic top view of a BSI image sensor. A BSI image sensor 500 includes four pixel regions 410 surrounding by a logic region 401, in which one or more semiconductor devices such as the semiconductor devices 207, additional circuitry and contacts for input and output connections to and from an array of the pixel regions 410 are disposed in the logic region 401. The logic region 401 is utilized to provide an operating environment for the pixel regions 410 and to moderate communications between the array of pixel regions 410 and other external devices (not shown). A cross section view of the pixel region 410 viewed from a cut line A-A' may have a configuration that is similar to or same as the configuration of FIG. 21, FIG. 22 FIG. 23 or FIG. 24. A projection of a reflective element (e.g., the reflective element 242, 342 or 442) is shown in FIG. 25, and the projection may cover at least 50% of an area of the pixel region 410, so that a proper efficiency of light-recycling can be achieved.

Accordingly, embodiments of the present disclosure therefore provide a BSI image sensor having a reflective element in a dielectric layer on a front side of a semiconductor substrate. The reflective element has a U-shaped profile with an opening facing toward a back side of the semiconductor substrate. Furthermore, the reflective element has an inner sidewall having a zigzag profile corresponding to a top-flat pyramid structure of the dielectric layer. The top-flat pyramid structure may be formed by etching the dielectric layer for several times, in which the etching operation is performed using a photoresist layer as a mask, and the photoresist layer may be trimmed before applied in each etching operation. Accordingly, the same photoresist layer can be repeatedly used to form the top-flat pyramid structure having multiple layers with different widths. Embodiments of the present disclosure at least have benefits such as a satisfactory light-recycling efficiency, low costs, and proper sensitivity and performance of the image sensor.

In some embodiments, a back side illumination (BSI) image sensor is provided. The BSI image sensor includes a semiconductor substrate, a first dielectric layer, a reflective element, a second dielectric layer and a color filter layer. The semiconductor substrate has a front side and a back side. The first dielectric layer is disposed on the front side of the semiconductor substrate. The reflective element is disposed on the first dielectric layer, in which the reflective element has an inner sidewall contacting the first dielectric layer, and the inner sidewall has a zigzag profile. The second dielectric layer is disposed on the first dielectric layer and the reflective element. The color filter layer is disposed on the backside of the semiconductor substrate.

In some embodiments, a back side illumination (BSI) image sensor is provided. The BSI image sensor includes a semiconductor substrate, a dielectric layer, a reflective element, and a color filter layer. The semiconductor substrate has a front side and a back side. The dielectric layer is disposed on the front side of the semiconductor substrate. The reflective element is embedded in the dielectric layer. The reflective element having a U-shaped profile and an opening of the U-shaped profile faces toward the back side of the semiconductor substrate. The color filter layer is disposed on the backside of the semiconductor substrate.

In some embodiments, a method is provided. The method includes the following operations. First, a semiconductor substrate having a front side and a back side is provided. Then, a first dielectric layer is formed over the front side of the semiconductor substrate. Next, a first photoresist layer is formed over the first dielectric layer. A first portion of the first dielectric layer is exposed from the first photoresist layer. Afterwards, the first dielectric layer is etched by using the first photoresist layer as a mask. Then, the first photoresist layer is trimmed to form a second photoresist layer. Thereafter, the first dielectric layer is etched using the second photoresist layer as a mask, such that a top-flat pyramid structure is formed over the first dielectric layer. Then, a reflective layer is deposited over the top-flat pyramid structure. Afterwards, the reflective layer is patterned to form a reflective element having an inner sidewall that is conformal to the top-flat pyramid structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illumination (BSI) image sensor, comprising:
   a semiconductor substrate having a front side and a back side;
   a first dielectric layer on the front side of the semiconductor substrate;
   a reflective element on the first dielectric layer, wherein the reflective element has an inner sidewall contacting the first dielectric layer, and the inner sidewall has a zigzag profile;
   a second dielectric layer on the first dielectric layer and the reflective element; and
   a color filter layer on the backside of the semiconductor substrate.

2. The BSI image sensor of claim 1, wherein the reflective element has a U-shaped profile.

3. The BSI image sensor of claim 1, wherein the first dielectric layer comprises a top-flat pyramid structure corresponding to the zigzag profile of the reflective element.

4. The BSI image sensor of claim 1, wherein a surface of the back side of the semiconductor comprises a microstructure having a wave profile.

5. The BSI image sensor of claim 4, wherein a projection of the reflective element on the surface of the back side of the semiconductor substrate overlaps the microstructure.

6. The BSI image sensor of claim 4, further comprising:
   a first trench isolation extending from a surface of the back side of the semiconductor substrate into the semiconductor substrate; and
   a second trench isolation extending from the surface of the back side of the semiconductor substrate into the semiconductor substrate, wherein the second trench isolation is adjacent to the first trench isolation, and the microstructure is disposed between the first and second isolation trenches.

7. The BSI image sensor of claim 4, wherein an insulating material layer is disposed between the color filter layer and the semiconductor substrate, and fills into the microstructure.

8. A back side illumination (BSI) image sensor, comprising:
   a semiconductor substrate having a front side and a back side;
   a first dielectric layer on the front side of the semiconductor substrate;
   a reflective element embedded in the first dielectric layer;
   a second dielectric layer between the front side of the semiconductor substrate and the reflective element, wherein the second dielectric layer and the reflective element form a multi-stepped interface; and
   a color filter layer on the backside of the semiconductor substrate.

9. The BSI image sensor of claim 8, further comprising:
   a semiconductor device on a surface of the front side of the semiconductor substrate and in the second dielectric layer, wherein the reflective element is over the semiconductor device.

10. The BSI image sensor of claim 9, further comprising:
    an interconnection structure on the front side of the semiconductor substrate and the first dielectric layer, wherein the interconnection structure comprises a metallization layer; and
    a contact via extending through the first dielectric layer and the second dielectric layer to electrically connect the semiconductor device and the metallization layer, wherein the first dielectric layer separates the reflective element from the metallization layer.

11. The BSI image sensor of claim 8, wherein an inner sidewall of the reflective element has a zigzag profile comprising at least two zigzag folds on each of two opposite sides of the reflective element.

12. The BSI image sensor of claim 11, wherein each of the zigzag folds has an included angle that is equal to about 90° and smaller than about 180°.

13. The BSI image sensor of claim 8, further comprising:
    a first trench isolation and a second trench isolation adjacent to the first trench isolation, wherein each of the first and second trench isolations extends from a surface of the back side of the semiconductor substrate into the semiconductor substrate,
    a pixel region between the first and second trench isolations and in the semiconductor substrate,
    wherein a projection of the reflective element on the pixel region covers at least 50% of an area of the pixel region.

14. The BSI image sensor of claim 13, wherein the semiconductor substrate has a microstructure on the surface of the back side of the semiconductor substrate and between the first and second trench isolations, the microstructure has a wave pattern that is covered by an insulating material of the first and second trench isolations.

15. A method, comprising:
    providing a semiconductor substrate having a front side and a back side;
    forming a first dielectric layer over the front side of the semiconductor substrate;

forming a first photoresist layer over the first dielectric layer, wherein a first portion of the first dielectric layer is exposed from the first photoresist layer;

etching the first dielectric layer by using the first photoresist layer as a mask;

trimming the first photoresist layer to form a second photoresist layer;

etching the first dielectric layer using the second photoresist layer as a mask, such that a top-flat pyramid structure is formed over the first dielectric layer;

depositing a reflective layer over the top-flat pyramid structure; and patterning the reflective layer to form a reflective element having an inner sidewall that is conformal to the top-flat pyramid structure.

16. The method of claim 15, wherein trimming the first photoresist layer comprises etching edge portions of the first photoresist layer to form the second photoresist layer having a smaller width than a width of the first photoresist layer.

17. The method of claim 15, further comprising depositing a second dielectric layer on the first dielectric layer and the reflective element.

18. The method of claim 15, further comprising forming a first trench isolation and a second trench isolation extending from a surface of the back side of the semiconductor substrate into the semiconductor substrate, wherein the first and second trench isolations are on two opposing sides of the reflective element.

19. The method of claim 18, wherein etching the first dielectric layer by using the first photoresist layer as the mask comprises forming a second portion of the first dielectric layer protruding from the first portion of the first dielectric layer.

20. The method of claim 19, wherein etching the first dielectric layer by using the second photoresist layer as the mask comprises etching the first portion of the first dielectric layer and edge portions of the second portion.

* * * * *